US011804482B2

(12) United States Patent
Hsu et al.

(10) Patent No.: US 11,804,482 B2
(45) Date of Patent: Oct. 31, 2023

(54) TRANSISTOR DRAIN DESIGN FOR ESD PROTECTION AND MANUFACTURING METHOD THEREOF

(71) Applicant: TAIWAN SEMICONDUCTOR MANUFACTURING COMPANY LTD., Hsinchu (TW)

(72) Inventors: Sheng-Fu Hsu, Hsinchu (TW); Hsiao-Ching Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 14 days.

(21) Appl. No.: 17/037,125

(22) Filed: Sep. 29, 2020

(65) Prior Publication Data

US 2022/0102337 A1    Mar. 31, 2022

(51) Int. Cl.
  *H01L 21/82*    (2006.01)
  *H01L 27/02*    (2006.01)
  *H01L 29/08*    (2006.01)
  *H01L 21/8234*   (2006.01)
  *H01L 29/423*   (2006.01)

(52) U.S. Cl.
  CPC .. *H01L 27/0266* (2013.01); *H01L 21/823493* (2013.01); *H01L 29/0847* (2013.01); *H01L 29/42356* (2013.01)

(58) Field of Classification Search
  CPC ... H01L 29/08; H01L 29/084; H01L 29/0847; H01L 29/42; H01L 29/423; H01L 29/4235; H01L 29/42356; H01L 27/02; H01L 27/026; H01L 27/0266; H01L 21/82; H01L 21/823; H01L 21/8234; H01L 21/82349; H01L 21/823493
  USPC ......................................................... 257/499
  See application file for complete search history.

(56) References Cited

U.S. PATENT DOCUMENTS

| 8,115,256 B2 * | 2/2012 | Yoneda ............... H01L 21/8249 327/437 |
| 10,020,393 B2 * | 7/2018 | Hsiao ................ H01L 29/66689 |
| 2011/0039378 A1 * | 2/2011 | Voidman ......... H01L 21/823814 257/E21.334 |

* cited by examiner

*Primary Examiner* — Monica D Harrison
(74) *Attorney, Agent, or Firm* — WPAT LAW; Anthony King

(57) ABSTRACT

A semiconductor device is provided. The semiconductor device comprises a substrate of a first type, a first doped region embedded within the substrate and having a first portion and a second portion, and a first gate electrode disposed above the substrate. The semiconductor device further comprises a well region of a second type and embedded within the substrate. The well region is in contact with the second portion of the first doped region.

20 Claims, 15 Drawing Sheets

TRANSISTOR DRAIN DESIGN FOR ESD PROTECTION AND MANUFACTURING METHOD THEREOF

BACKGROUND

The present invention relates generally to integrated circuit (IC) designs, and more particularly to a transistor structure for electrostatic discharge (ESD) protection and the manufacturing method thereof.

ESD events occur when static electricity is suddenly discharged from a body surface to a device. Semiconductor devices of ICs can be damaged by ESD events. For example, during manufacturing or testing of ICs, an ESD event can occur between an engineer's finger and a semiconductor wafer on which semiconductor devices are located, causing abnormally high currents and/or voltages in the semiconductor wafer that can damage the semiconductor devices of the semiconductor wafer. These abnormally high currents and/or voltages can catastrophically damage the semiconductor devices of the semiconductor wafer in a number of ways, i.e., by blowing out a gate oxide or causing junction damage. ESD protection devices have been developed to protect against such ESD events.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
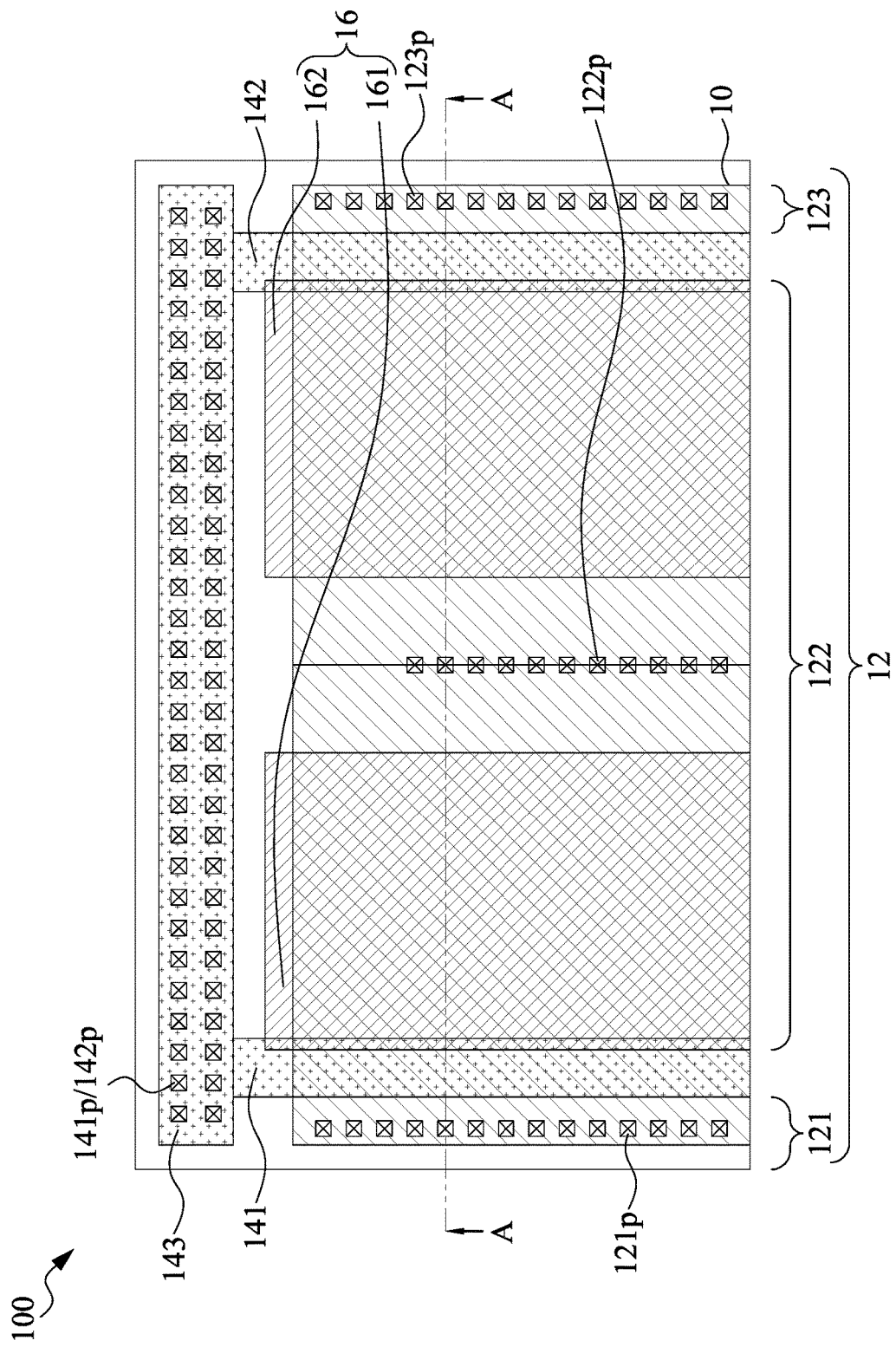
FIG. 1A illustrates a schematic view of a layout of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A metal-oxide-semiconductor (MOS) transistor of an IC is very susceptible to damage. The MOS transistor may be destroyed by coming into contact with a voltage only a few volts higher than a supply voltage of the IC. It is understood that a regular supply voltage is typically 6.0, 5.0, 4.5 volts or even lower. Electrostatic voltages from common environmental sources (for example, from a human body) can easily reach thousands, or even tens of thousands of volts. Such voltages are destructive even though the charge and any resulting current are extremely small. Therefore, it is important to discharge any static electric charge as it builds up, before it damages the IC.

The ESD events, based on their causes and manners of discharge to ICs, can be categorized into several types, and different types of ESD events and be measured according to different standards, such as Human-Body Model (HBM), Machine Model (MM), Charged-Device Model (CDM) and Field-Induced Model (FIM). The voltage that can be withstood by a device can be tested, and an ESD level can be given in accordance with one of the aforementioned models.

Several methodologies are commonly used to improve the ESD level of an MOS transistor. For example, the width of the silicide blocking layer of the drain can be increased. In addition, gate-to-source resistors can be added to an MOS transistor. Furthermore, the dimension/size of an MOS transistor can be increased. In some other examples, the active region of an MOS transistor can be enlarged. Nevertheless, even by adopting the above-mentioned methodologies, the ESD level of an MOS transistor is still poor. Therefore, MOS transistors that are structured to have a great ability to withstand ESD events are proposed.

FIG. 1A illustrates a schematic view of a layout of a semiconductor device, in accordance with some embodiments of the present disclosure.

FIG. 1A shows a layout of a semiconductor device 100. The layout shown in FIG. 1A is the top view of a semiconductor device 100. The semiconductor device 100 includes an active region 10, a doped region 12, gate regions 141, 142 and 143, and a blocking region 16.

The active region 10 can be referred to as a substrate 10 in the subsequent paragraphs. The doped region 12 includes a first portion 121, a second portion 122 and a third portion 123. The first portion 121 can be a source region of the semiconductor device 100. The second portion 122 can be a drain region of the semiconductor device 100. The third portion 123 can be another source region of the semiconductor device 100. In some embodiments, the doped region 12 can be an n-type doped region. In other embodiments, the doped region 12 can be a p-type doped region.

Several contacts 121$p$ can be disposed within the first portion 121 of the doped region 12. The contacts 121$p$ can be, for example, metal pads that are electrically coupled with the first portion 121 of the doped region 12. Several contacts 122$p$ can be disposed within the second portion 122 of the doped region 12. The contacts 122$p$ can be, for example, metal pads that are electrically coupled with the second portion 122 of the doped region 12. Several contacts 123$p$ can be disposed within the third portion 123 of the doped region 12. The contacts 123$p$ can be, for example, metal pads that are electrically coupled with the third portion 123 of the doped region 12.

In some embodiments, the gate regions 141 and 142 can be disposed parallelly to each other, as shown in FIG. 1A. In some embodiments, the gate regions 141 and 142 can extend along the same direction. In other embodiments, an angle may exist between the directions in which the gate regions 141 and 142 extend. The gate regions 141 and 142 can include conductive materials. In some embodiments, the gate regions 141 and 142 can include metals. In some embodiments, the gate regions 141 and 142 can include semiconductors. In some embodiments, the gate regions 141 and 142 can include polysilicon. The gate regions 141 and 142 can also be referred to as gate electrodes 141 and 142.

The gate region 141 can extend and be in contact with the gate region 143. The gate region 142 can extend and be in contact with the gate region 143. The gate region 143 can extend along a direction substantially perpendicular to a direction in which the gate region 141 extends. The gate region 143 can extend along a direction substantially perpendicular to a direction in which the gate region 142 extends. In other embodiments, an angle different from 90 degrees may exist between the directions in which the gate regions 141 and 143 extend. In other embodiments, an angle different from 90 degrees may exist between the directions in which the gate regions 142 and 143 extend.

Several contacts 141$p$/142$p$ can be disposed within the gate region 143. The contacts 141$p$/142$p$ can be, for example, metal pads that are electrically coupled with the gate region 143. Since the gate region 143 is in contact with the gate region 141, the contacts 141$p$/142$p$ can also be electrically coupled with the gate region 141. Since the gate region 143 is in contact with the gate region 142, the contacts 141$p$/142$p$ can also be electrically coupled with the gate region 142.

The blocking region 16 includes a first portion 161 and a second portion 162. The blocking region 16 can also be referred to as a blocking layer 16. The first portion 161 of the blocking region 16 can be partially overlapped with the gate region 141. The first portion 161 of the blocking region 16 can partially cover the gate region 141. The second portion 162 of the blocking region 16 can be partially overlapped with the gate region 142. The second portion 162 of the blocking region 16 can partially cover the gate region 142. In some embodiments, the blocking layer 16 can be a silicide blocking layer. The blocking layer 16 can improve, to a certain extent, the ESD robustness of the semiconductor device 100.

Figure 1B:
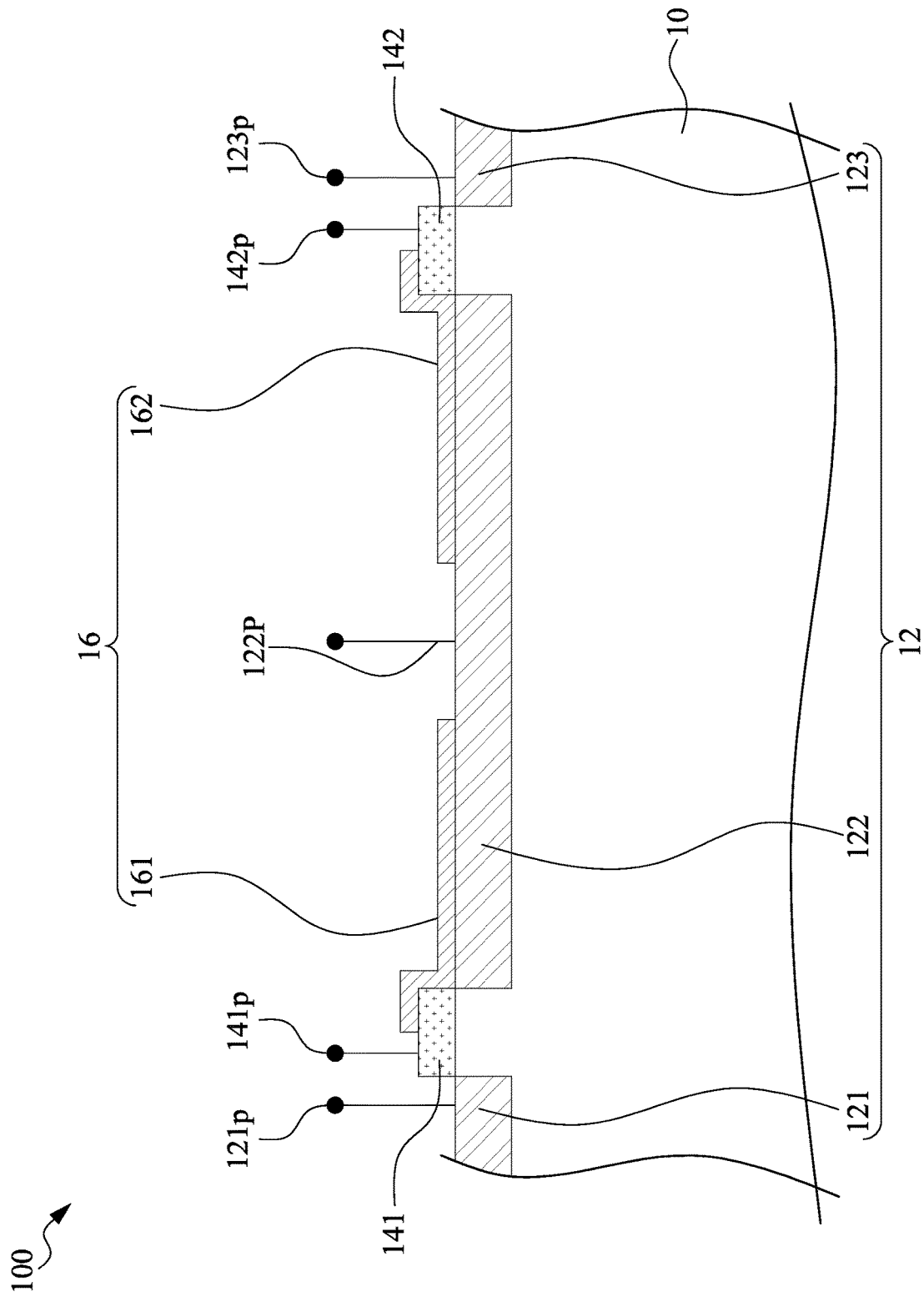
FIG. 1B illustrates a schematic view of a cross-sectional view of a semiconductor device, in accordance with some embodiments of the present disclosure.

FIG. 1B illustrates a schematic view of a cross-sectional view of a semiconductor device, in accordance with some embodiments of the present disclosure.

FIG. 1B shows a cross-sectional view of the semiconductor device 100. FIG. 1B can be a cross-sectional view along the dotted-line A of FIG. 1A. The semiconductor device 100 includes a substrate 10, a doped region 12, gate electrodes 141 and 142, and a blocking layer 16.

In some embodiments, the substrate 10 can include intrinsic semiconductor materials. In some embodiments, the substrate 10 can include extrinsic semiconductor materials.

In some embodiments, the substrate 10 can be lightly doped. In some embodiments, the substrate 10 can be a p-type substrate. In other embodiments, the substrate 10 can be an n-type substrate.

The doped region 12 includes a first portion 121, a second portion 122 and a third portion 123. The first portion 121 can be a source region of the semiconductor device 100. The second portion 122 can be a drain region of the semiconductor device 100. The third portion 123 can be another source region of the semiconductor device 100. In some embodiments, the doped region 12 can be an n-type doped region. In other embodiments, the doped region 12 can be a p-type doped region.

The gate electrode 141 can be disposed above the substrate 10 and between the first portion 121 and the second portion 122 of the doped region 12. The gate electrode 142 can be disposed above the substrate 10 and between the third portion 123 and the second portion 122 of the doped region 12. The gate electrode 141 can be disposed on a surface coplanar with the upper surfaces of the first portion 121 and the second portion 122 of the doped region 12. The gate electrode 142 can be disposed on a surface coplanar with the upper surfaces of the third portion 123 and the second portion 122 of the doped region 12.

The blocking layer 16 includes a first portion 161 and a second portion 162. The first portion 161 of the blocking layer 16 can be partially overlapped with the gate electrode 141. The first portion 161 of the blocking layer 16 can be partially overlapped with the second portion 122 of the doped region 12. The first portion 161 of the blocking layer 16 partially covers the gate electrode 141. The first portion 161 of the blocking layer 16 partially covers the second portion 122 of the doped region 12. The first portion 161 of the blocking layer 16 exposes a portion of the gate electrode 141. The first portion 161 of the blocking layer 16 exposes a portion of the second portion 122 of the doped region 12.

The second portion 162 of the blocking layer 16 can be partially overlapped with the gate electrode 142. The second portion 162 of the blocking layer 16 can be partially overlapped with the second portion 122 of the doped region 12. The second portion 162 of the blocking layer 16 partially covers the gate electrode 142. The second portion 162 of the blocking layer 16 partially covers the second portion 122 of the doped region 12. The second portion 162 of the blocking layer 16 exposes a portion of the gate electrode 142. The second portion 162 of the blocking layer 16 exposes a portion of the second portion 122 of the doped region 12.

The contact 121p can be electrically coupled with the first region 121 of the doped region 12. The contact 122p can be electrically coupled with the second region 122 of the doped region 12. The contact 123p can be electrically coupled with the third region 123 of the doped region 12. The contact 141p electrically can be coupled with the gate electrode 141. The contact 142p can be electrically coupled with the gate electrode 142.

Figure 2A:
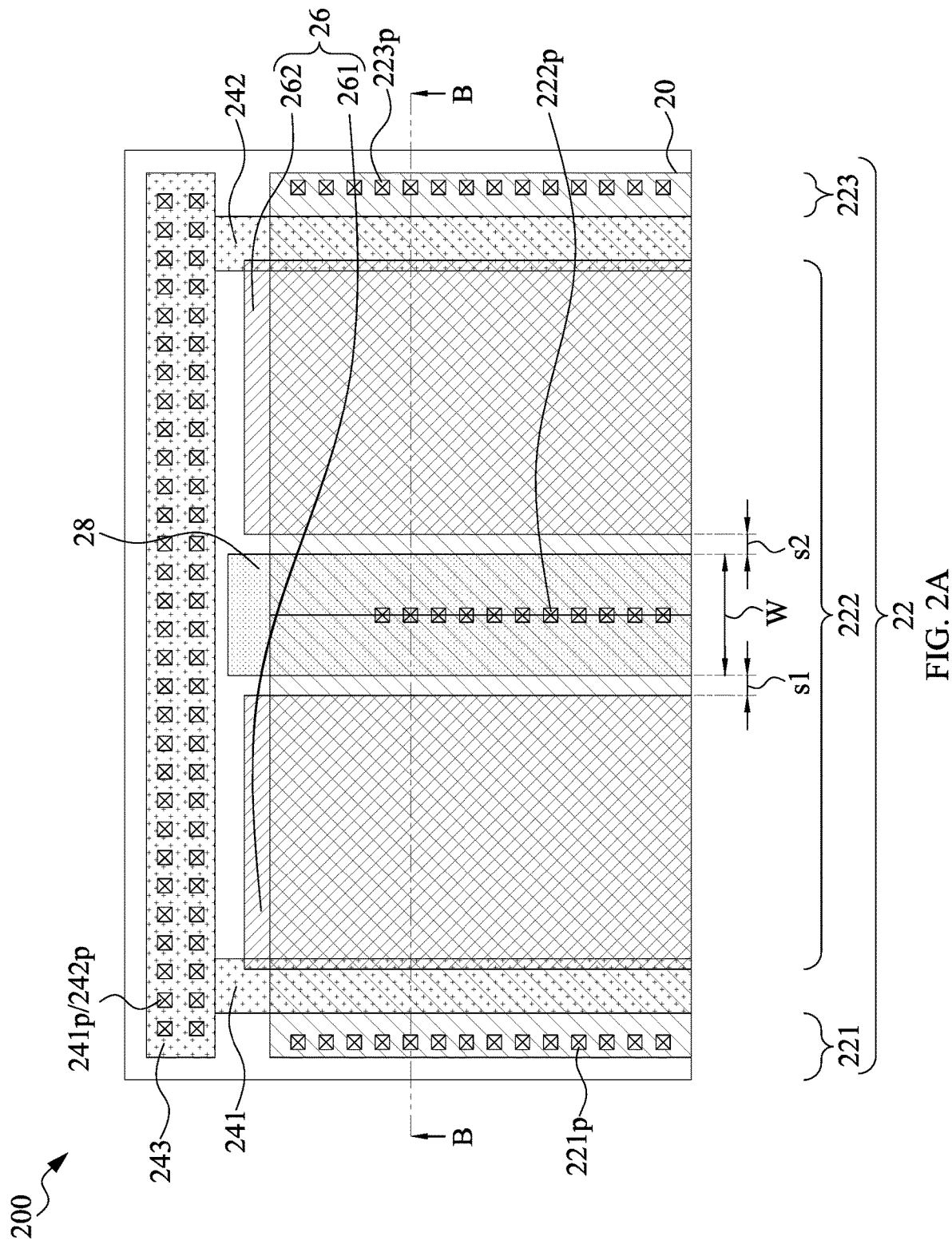
FIG. 2A illustrates a schematic view of a layout of a semiconductor device, in accordance with some embodiments of the present disclosure.

FIG. 2A illustrates a schematic view of a layout of a semiconductor device, in accordance with some embodiments of the present disclosure.

FIG. 2A shows a layout of a semiconductor device 200. The layout shown in FIG. 2A is the top view of a semiconductor device 200. The semiconductor device 200 includes an active region 20, a doped region 22, gate regions 241, 242 and 243, and a blocking region 26. Different from the semiconductor device 100, the semiconductor device 200 further includes a well region 28.

The active region 20 can be referred to as a substrate 20 in the subsequent paragraphs. The doped region 22 includes a first portion 221, a second portion 222 and a third portion 223. The first portion 221 can be a source region of the semiconductor device 200. The second portion 222 can be a drain region of the semiconductor device 200. The third portion 223 can be another source region of the semiconductor device 200. In some embodiments, the doped region 22 can be an n-type doped region. In other embodiments, the doped region 22 can be a p-type doped region.

Several contacts 221p can be disposed within the first portion 221 of the doped region 22. The contacts 221p can be, for example, metal pads that are electrically coupled with the first portion 221 of the doped region 22. Several contacts 222p can be disposed within the second portion 222 of the doped region 22. The contacts 222p can be, for example, metal pads that are electrically coupled with the second portion 222 of the doped region 22. Several contacts 223p can be disposed within the third portion 223 of the doped region 22. The contacts 223p can be, for example, metal pads that are electrically coupled with the third portion 223 of the doped region 22.

In some embodiments, the gate regions 241 and 242 can be disposed parallelly to each other, as shown in FIG. 2A. In some embodiments, the gate regions 241 and 242 can extend along the same direction. In other embodiments, an angle may exist between the directions in which the gate regions 241 and 242 extend. The gate regions 241 and 242 can include conductive materials. In some embodiments, the gate regions 241 and 242 can include metals. In some embodiments, the gate regions 241 and 242 can include semiconductors. In some embodiments, the gate regions 241 and 242 can include polysilicon. The gate regions 241 and 242 can also be referred to as gate electrodes 241 and 242.

The gate region 241 can extend and be in contact with the gate region 243. The gate region 242 can extend and be in contact with the gate region 243. The gate region 243 can extend along a direction substantially perpendicular to a direction in which the gate region 241 extends. The gate region 243 can extend along a direction substantially perpendicular to a direction in which the gate region 242 extends. In other embodiments, an angle different from 90 degrees may exist between the directions in which the gate regions 241 and 243 extend. In other embodiments, an angle different from 90 degrees may exist between the directions in which the gate regions 242 and 243 extend.

Several contacts 241p/242p can be disposed within the gate region 243. The contacts 241p/242p can be, for example, metal pads that are electrically coupled with the gate region 243. Since the gate region 243 is in contact with the gate region 241, the contacts 241p/242p can also be electrically coupled with the gate region 241. Since the gate region 243 is in contact with the gate region 242, the contacts 241p/242p can also be electrically coupled with the gate region 242.

The blocking region 26 includes a first portion 261 and a second portion 262. The blocking region 26 can also be referred to as a blocking layer 26. The first portion 261 of the blocking region 26 can be partially overlapped with the gate region 241. The first portion 261 of the blocking region 26 can partially cover the gate region 241. The second portion 262 of the blocking region 26 can be partially overlapped with the gate region 242. The second portion 262 of the blocking region 26 can partially cover the gate region 242. In some embodiments, the blocking layer 26 can be a silicide blocking layer. The blocking layer 26 can improve, to a certain extent, the ESD robustness of the semiconductor device 200.

In the top view, the well region 28 can be disposed between the first portion 261 of the blocking region 26 and the second portion 262 of the blocking region 26. The well region 28 includes a width W. In some embodiments, the width W of the well region 28 may range from about 0.55 um to about 1.55 um.

A distance s1 may exist between an edge of the first portion 261 of the blocking region 26 and an edge of the well region 28. A distance s2 may exist between an edge of the second portion 262 of the blocking region 26 and an edge of the well region 28. In some embodiments, the distance s1 can be substantially identical to the distance s2. In some embodiments, the distance s1 can be different from the distance s2. In some embodiments, the distance s1 may range from about 0.1 um (micrometer) to about 0.8 um. In some embodiments, the distance s2 may range from about 0.1 um to about 0.8 um.

Figure 2B:
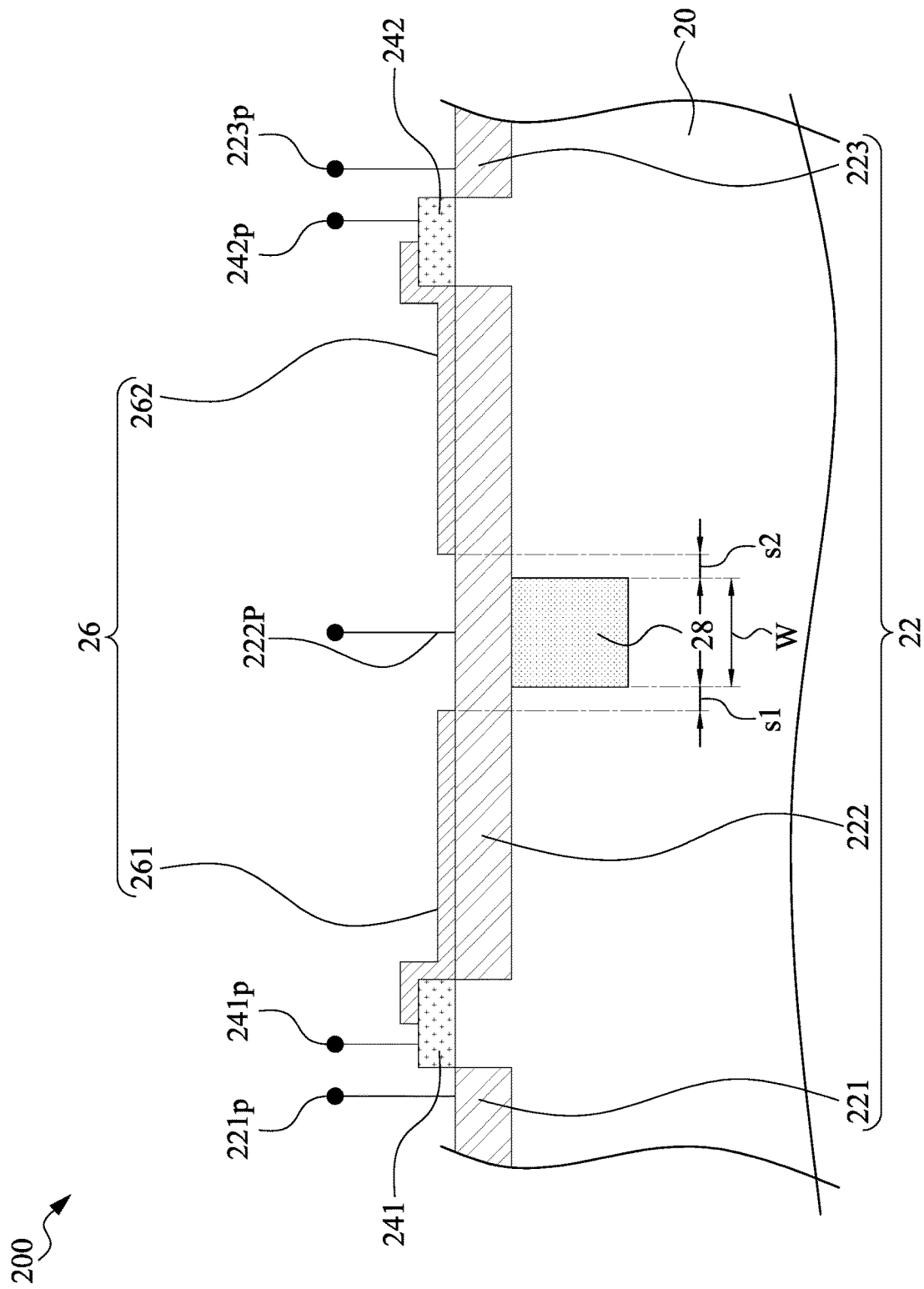
FIG. 2B illustrates a schematic view of a cross-sectional view of a semiconductor device, in accordance with some embodiments of the present disclosure.

FIG. 2B illustrates a schematic view of a cross-sectional view of a semiconductor device, in accordance with some embodiments of the present disclosure.

FIG. 2B shows a cross-sectional view of the semiconductor device 200. FIG. 2B can be a cross-sectional view along the dotted-line B of FIG. 2A. The semiconductor device 200 includes a substrate 20, a doped region 22, gate electrodes 241 and 242, and a blocking layer 26. The semiconductor device 200 further includes a well region 28.

In some embodiments, the substrate 20 can include intrinsic semiconductor materials. In some embodiments, the substrate 20 can include extrinsic semiconductor materials. In some embodiments, the substrate 20 can be lightly doped. In some embodiments, the substrate 20 can be a p-type substrate. In other embodiments, the substrate 20 can be an n-type substrate.

The doped region 22 includes a first portion 221, a second portion 222 and a third portion 223. The first portion 221 can be a source region of the semiconductor device 200. The second portion 222 can be a drain region of the semiconductor device 200. The third portion 223 can be another source region of the semiconductor device 200. In some embodiments, the doped region 22 can be an n-type doped region. In other embodiments, the doped region 22 can be a p-type doped region.

The gate electrode 241 can be disposed above the substrate 20 and between the first portion 221 and the second portion 222 of the doped region 22. The gate electrode 242 can be disposed above the substrate 20 and between the third portion 223 and the second portion 222 of the doped region 22. The gate electrode 241 can be disposed on a surface coplanar with the upper surfaces of the first portion 221 and the second portion 222 of the doped region 22. The gate electrode 242 can be disposed on a surface coplanar with the upper surfaces of the third portion 223 and the second portion 222 of the doped region 22.

The blocking layer 26 includes a first portion 261 and a second portion 262. The first portion 261 of the blocking layer 26 can be partially overlapped with the gate electrode 241. The first portion 261 of the blocking layer 26 can be partially overlapped with the second portion 222 of the doped region 22. The first portion 261 of the blocking layer 26 partially covers the gate electrode 241. The first portion 261 of the blocking layer 26 partially covers the second portion 222 of the doped region 22. The first portion 261 of the blocking layer 26 exposes a portion of the gate electrode 241. The first portion 261 of the blocking layer 26 exposes a portion of the second portion 222 of the doped region 22.

The second portion 262 of the blocking layer 26 can be partially overlapped with the gate electrode 242. The second portion 262 of the blocking layer 26 can be partially overlapped with the second portion 222 of the doped region 22. The second portion 262 of the blocking layer 26 partially covers the gate electrode 242. The second portion 262 of the blocking layer 26 partially covers the second portion 222 of the doped region 22. The second portion 262 of the blocking layer 26 exposes a portion of the gate electrode 242. The second portion 262 of the blocking layer 26 exposes a portion of the second portion 222 of the doped region 22.

The contact 221p can be electrically coupled with the first region 221 of the doped region 22. The contact 222p can be electrically coupled with the second region 222 of the doped region 22. The contact 223p can be electrically coupled with the third region 223 of the doped region 22. The contact 241p can be electrically coupled with the gate electrode 241. The contact 242p can be electrically coupled with the gate electrode 242.

The blocking layer 26 exposes a portion of the doped region 22. Several contacts 222p can be in contact with the exposed portion of the doped region 22. The opening between the first portion 261 and the second portion 262 of the blocking layer 26 exposes a surface of the doped region 22. Several contacts 222p can be in contact with the exposed surface of the doped region 22.

The well region 28 can be disposed under the second region 222 of the doped region 22. The well region 28 can be embedded within the substrate 20. The well region 28 can be in contact with the second region 222 of the doped region 22. The well region 28 can have a width W. A distance s1 may exist between the first portion 261 of the blocking region 26 and the well region 28. A distance s2 may exist between the second portion 262 of the blocking region 26 and the well region 28.

In some embodiments, the well region 28 may include impurities/dopants of a first type. In some embodiments, the well region 28 may include impurities/dopants of a type different from that of the substrate 20. In some embodiments, the well region 28 may include impurities/dopants of a type identical to that of the doped region 22. The dosage of the impurities/dopants of the doped region 22 can be higher than that of the well region 28.

In some embodiments, the well region 28 can be an n-type well embedded within a p-type substrate 20. In other embodiments, the well region 28 can be a p-type well embedded within an n-type substrate 20. In some embodiments, the well region 28 can be an n-type well in contact with the second portion 222 of the n-type doped region 22. In other embodiments, the well region 28 can be a p-type well in contact with the second portion 222 of the p-type doped region 22.

When ESD events occur, a high voltage/current may be applied to the contact 222p. The well region 28 in contact with the doped region 22 may facilitate passing the high voltage/current from the contact 222p toward the bulk/body (not shown) of the semiconductor 200. The well region 28 having the same type of impurities/dopants as the doped region 22 may facilitate directing the high voltage/current from the contact 222p toward the bulk/body (not shown) of the semiconductor 200. Passing/directing high voltage/current toward the bulk/body can reduce the possibility of the semiconductor 200 being damaged by the ESD events. The well region 28 can reduce the possibility of the other circuits adjacent to the semiconductor 200 being damaged by the ESD events. The well region 28 can reduce the possibility of the other circuits coupled with the semiconductor 200 being damaged by the ESD events.

Figure 3A:
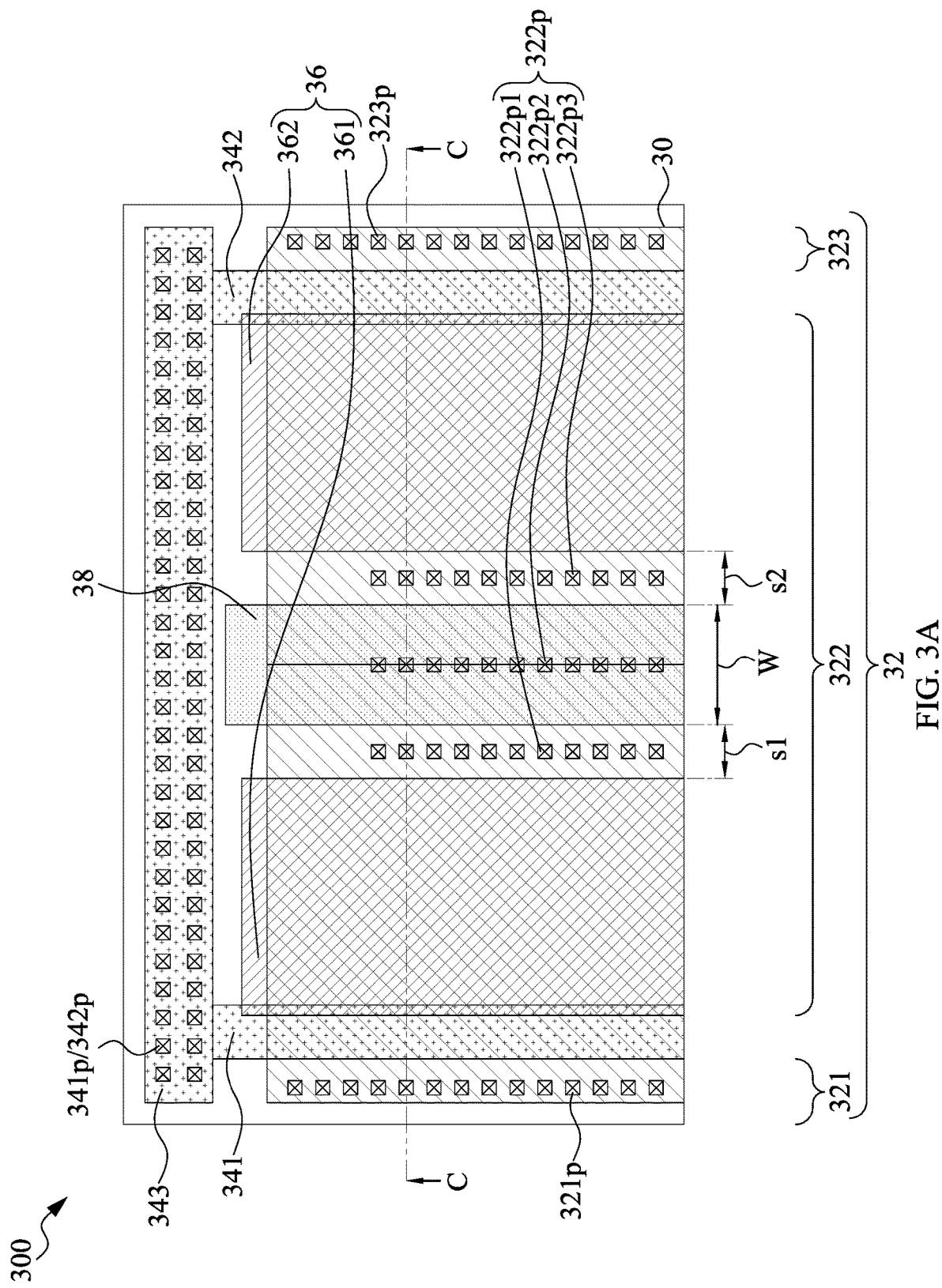
FIG. 3A illustrates a schematic view of a layout of a semiconductor device, in accordance with some embodiments of the present disclosure.

FIG. 3A illustrates a schematic view of a layout of a semiconductor device, in accordance with some embodiments of the present disclosure.

FIG. 3A shows a layout of a semiconductor device 300. The layout shown in FIG. 3A is the top view of a semiconductor device 300. The semiconductor device 300 includes an active region 30, a doped region 32, gate regions 341, 342 and 343, and a blocking region 36. Similar to the semiconductor device 200, the semiconductor device 300 includes a well region 38.

The active region 30 can be referred to as a substrate 30 in the subsequent paragraphs. The doped region 32 includes a first portion 321, a second portion 322 and a third portion 323. The first portion 321 can be a source region of the semiconductor device 300. The second portion 322 can be a drain region of the semiconductor device 300. The third portion 323 can be another source region of the semiconductor device 300. In some embodiments, the doped region 32 can be an n-type doped region. In other embodiments, the doped region 32 can be a p-type doped region.

Several contacts 321p can be disposed within the first portion 321 of the doped region 32. The contacts 321p can be, for example, metal pads that are electrically coupled with the first portion 321 of the doped region 32. Several contacts 322p can be disposed within the second portion 322 of the doped region 32. The contacts 322p can be, for example, metal pads that are electrically coupled with the second portion 322 of the doped region 32.

Referring to FIG. 3A, the contacts 322p may include contacts 322p1, 322p2 and 322p3. In the top view, the contacts 322p1 are disposed between the first portion 361 of the blocking region 36 and the well region 38. In the top view, the contacts 322p2 are disposed within the range of the well region 38. In the top view, the contacts 322p3 are disposed between the second portion 362 of the blocking region 36 and the well region 38.

Several contacts 323p can be disposed within the third portion 323 of the doped region 32. The contacts 323p can be, for example, metal pads that are electrically coupled with the third portion 323 of the doped region 32.

In some embodiments, the gate regions 341 and 342 can be disposed parallelly to each other, as shown in FIG. 3A. In some embodiments, the gate regions 341 and 342 can extend along the same direction. In other embodiments, an angle may exist between the directions in which the gate regions 341 and 342 extend. The gate regions 341 and 342 can include conductive materials. In some embodiments, the gate regions 341 and 342 can include metals. In some embodiments, the gate regions 341 and 342 can include semiconductors. In some embodiments, the gate regions 341 and 342 can include polysilicon. The gate regions 341 and 342 can also be referred to as gate electrodes 341 and 342.

The gate region 341 can extend and be in contact with the gate region 343. The gate region 342 can extend and be in contact with the gate region 343. The gate region 343 can extend along a direction substantially perpendicular to a direction in which the gate region 341 extends. The gate region 343 can extend along a direction substantially perpendicular to a direction in which the gate region 342 extends. In other embodiments, an angle different than 90 degrees may exist between the directions in which the gate regions 341 and 343 extend. In other embodiments, an angle different from 90 degrees may exist between the directions in which the gate regions 342 and 343 extend.

Several contacts 341p/342p can be disposed within the gate region 343. The contacts 341p/342p can be, for example, metal pads that are electrically coupled with the gate region 343. Since the gate region 343 is in contact with the gate region 341, the contacts 341p/342p can also be electrically coupled with the gate region 341. Since the gate region 343 is in contact with the gate region 342, the contacts 341p/342p can also be electrically coupled with the gate region 342.

The blocking region 36 includes a first portion 361 and a second portion 362. The blocking region 36 can also be referred to as a blocking layer 36. The first portion 361 of the blocking region 36 can be partially overlapped with the gate region 341. The first portion 361 of the blocking region 36 can partially cover the gate region 341. The second portion 362 of the blocking region 36 can be partially overlapped with the gate region 342. The second portion 362 of the blocking region 36 can partially cover the gate region 342. In some embodiments, the blocking layer 36 can be a silicide blocking layer. The blocking layer 36 can improve, to a certain extent, the ESD robustness of the semiconductor device 300.

In the top view, the well region 38 can be disposed between the first portion 361 of the blocking region 36 and the second portion 362 of the blocking region 36. The well region 38 includes a width W. In some embodiments, the width W of the well region 38 may range from about 0.55 um to about 1.55 um.

A distance s1 may exist between an edge of the first portion 361 of the blocking region 36 and an edge of the well region 38. A distance s2 may exist between an edge of the second portion 362 of the blocking region 36 and an edge of the well region 38. In some embodiments, the distance s1 can be substantially identical to the distance s2. In some embodiments, the distance s1 can be different from the distance s2. In some embodiments, the distance s1 may range from about 0.1 um to about 0.8 um. In some embodiments, the distance s2 may range from about 0.1 um to about 0.8 um.

Figure 3B:
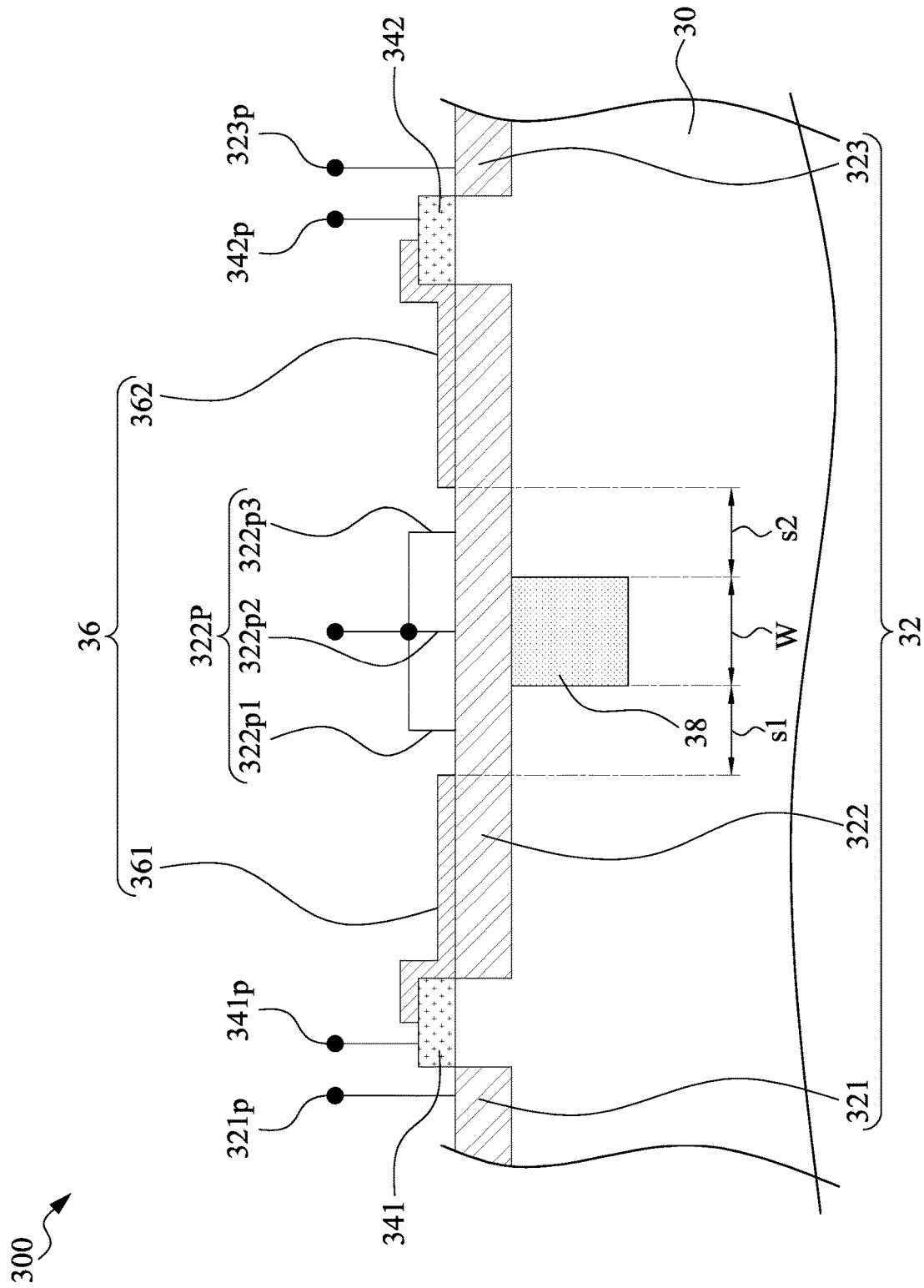
FIG. 3B illustrates a schematic view of a cross-sectional view of a semiconductor device, in accordance with some embodiments of the present disclosure.

FIG. 3B illustrates a schematic view of a cross-sectional view of a semiconductor device, in accordance with some embodiments of the present disclosure.

FIG. 3B shows a cross-sectional view of the semiconductor device 300. FIG. 3B can be a cross-sectional view along the dotted-line C of FIG. 3A. The semiconductor device 300 includes a substrate 30, a doped region 32, gate electrodes 341 and 342, and a blocking layer 36. The semiconductor device 300 further includes a well region 38.

In some embodiments, the substrate 30 can include intrinsic semiconductor materials. In some embodiments, the substrate 30 can include extrinsic semiconductor materials. In some embodiments, the substrate 30 can be lightly doped. In some embodiments, the substrate 30 can be a p-type substrate. In other embodiments, the substrate 30 can be an n-type substrate.

The doped region 32 includes a first portion 321, a second portion 322 and a third portion 323. The first portion 321 can be a source region of the semiconductor device 300. The second portion 322 can be a drain region of the semiconductor device 300. The third portion 323 can be another source region of the semiconductor device 300. In some embodiments, the doped region 32 can be an n-type doped region. In other embodiments, the doped region 32 can be a p-type doped region.

The gate electrode 341 can be disposed above the substrate 30 and between the first portion 321 and the second portion 322 of the doped region 32. The gate electrode 342 can be disposed above the substrate 30 and between the third portion 323 and the second portion 322 of the doped region 32. The gate electrode 341 can be disposed on a surface coplanar with the upper surfaces of the first portion 321 and the second portion 322 of the doped region 32. The gate electrode 342 can be disposed on a surface coplanar with the upper surfaces of the third portion 323 and the second portion 322 of the doped region 32.

The blocking layer 36 includes a first portion 361 and a second portion 362. The first portion 361 of the blocking layer 36 can be partially overlapped with the gate electrode 341. The first portion 361 of the blocking layer 36 can be partially overlapped with the second portion 322 of the doped region 32. The first portion 361 of the blocking layer 36 partially covers the gate electrode 341. The first portion 361 of the blocking layer 36 partially covers the second portion 322 of the doped region 32. The first portion 361 of the blocking layer 36 exposes a portion of the gate electrode 341. The first portion 361 of the blocking layer 36 exposes a portion of the second portion 322 of the doped region 32.

The second portion 362 of the blocking layer 36 can be partially overlapped with the gate electrode 342. The second portion 362 of the blocking layer 36 can be partially overlapped with the second portion 322 of the doped region 32. The second portion 362 of the blocking layer 36 partially covers the gate electrode 342. The second portion 362 of the blocking layer 36 partially covers the second portion 322 of the doped region 32. The second portion 362 of the blocking layer 36 exposes a portion of the gate electrode 342. The second portion 362 of the blocking layer 36 exposes a portion of the second portion 322 of the doped region 32.

The contact 321$p$ can be electrically coupled with the first region 321 of the doped region 32. The contact 322$p$ can be electrically coupled with the second region 322 of the doped region 32. The contact 323$p$ can be electrically coupled with the third region 323 of the doped region 32. The contact 341$p$ can be electrically coupled with the gate electrode 341. The contact 342$p$ can be electrically coupled with the gate electrode 342.

The blocking layer 36 exposes a portion of the doped region 32. Several contacts 322$p$ can be in contact with the exposed portion of the doped region 32. The opening between the first portion 361 and the second portion 362 of the blocking layer 36 exposes a surface of the doped region 32. Several contacts 322$p$ can be in contact with the exposed surface of the doped region 32.

The contact 322$p$1 can be disposed closer to an edge of the first portion 361 of the blocking layer 36 than the contact 322$p$2. The contact 322$p$3 can be disposed closer to an edge of the second portion 362 of the blocking layer 36 than the contact 322$p$2.

The well region 38 can be disposed under the second region 322 of the doped region 32. The well region 38 can be embedded within the substrate 30. The well region 38 can be in contact with the second region 322 of the doped region 32. The well region 38 can have a width W. A distance s1 may exist between the first portion 361 of the blocking region 36 and the well region 38. A distance s2 may exist between the second portion 362 of the blocking region 36 and the well region 38.

In some embodiments, the well region 38 may include impurities/dopants of a first type. In some embodiments, the well region 38 may include impurities/dopants of a type different from that of the substrate 30. In some embodiments, the well region 38 may include impurities/dopants of a type identical to that of the doped region 32. The dosage of the impurities/dopants of the doped region 32 can be higher than that of the well region 38.

In some embodiments, the well region 38 can be an n-type well embedded within a p-type substrate 30. In other embodiments, the well region 38 can be a p-type well embedded within an n-type substrate 30. In some embodiments, the well region 38 can be an n-type well in contact with the second portion 322 of the n-type doped region 32. In other embodiments, the well region 38 can be a p-type well in contact with the second portion 322 of the p-type doped region 32.

When ESD events occur, a high voltage/current may be applied to the contact 322$p$. The well region 38 in contact with the doped region 32 may facilitate passing the high voltage/current from the contact 322$p$ toward the bulk/body (not shown) of the semiconductor 300. The well region 38 having the same type of impurities/dopants as the doped region 32 may facilitate directing the high voltage/current from the contact 322$p$ toward the bulk/body (not shown) of the semiconductor 300. Passing/directing high voltage/current toward the bulk/body can reduce the possibility of the semiconductor 300 being damaged by the ESD events. The well region 38 can reduce the possibility of the other circuits adjacent to the semiconductor 300 being damaged by the ESD events. The well region 38 can reduce the possibility of the other circuits coupled with the semiconductor 300 being damaged by the ESD events.

Figure 4A:
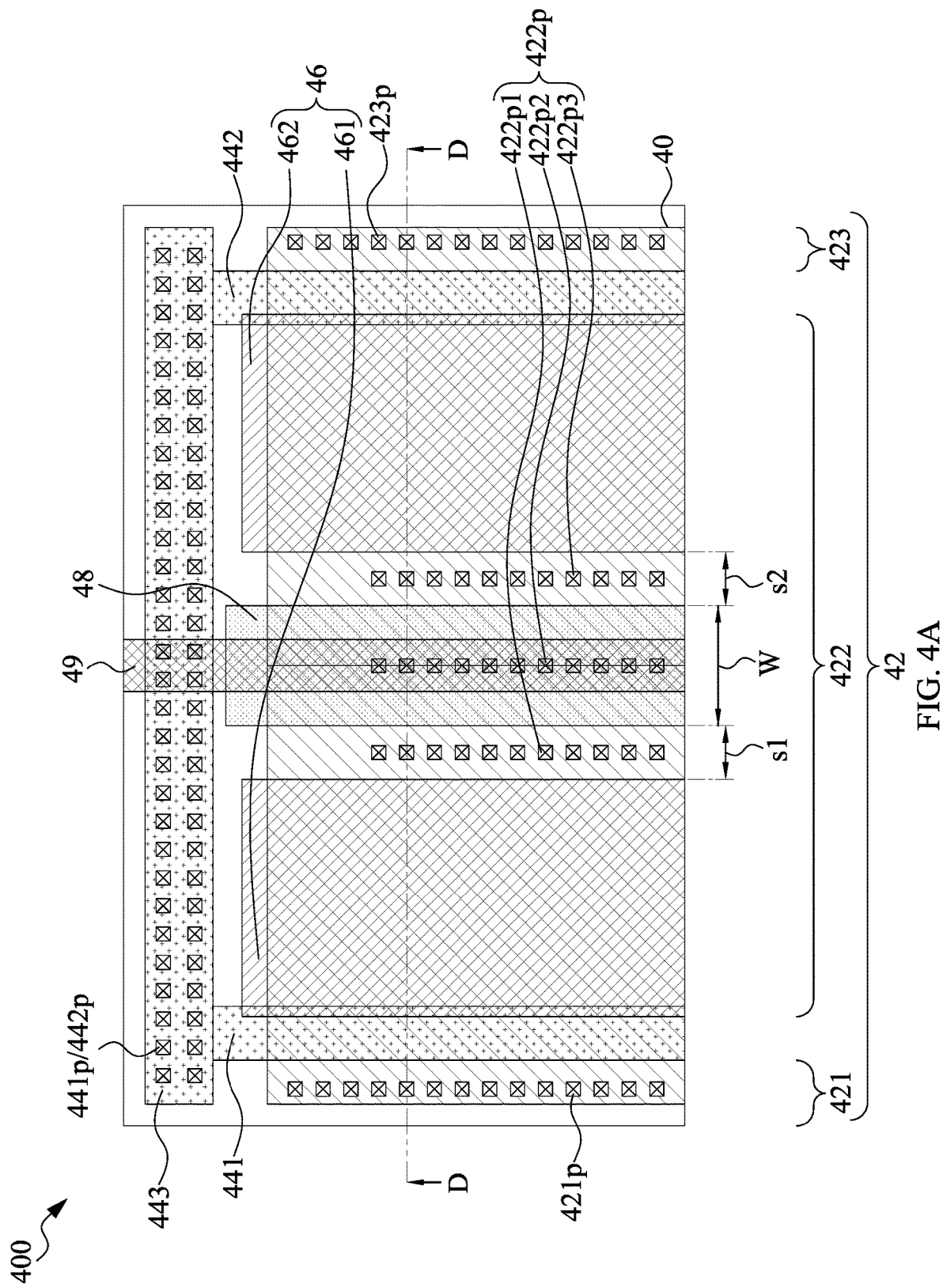
FIG. 4A illustrates a schematic view of a layout of a semiconductor device, in accordance with some embodiments of the present disclosure.

FIG. 4A illustrates a schematic view of a layout of a semiconductor device, in accordance with some embodiments of the present disclosure.

FIG. 4A shows a layout of a semiconductor device 400. The layout shown in FIG. 4A is the top view of a semiconductor device 400. The semiconductor device 400 includes an active region 40, a doped region 42, gate regions 441, 442 and 443, and a blocking region 46. The semiconductor device 400 further includes a well region 48 and a doped region 49.

The active region 40 can be referred to as a substrate 40 in the subsequent paragraphs. The doped region 42 includes a first portion 421, a second portion 422 and a third portion 423. The first portion 421 can be a source region of the semiconductor device 400. The second portion 422 can be a drain region of the semiconductor device 400. The third portion 423 can be another source region of the semiconductor device 400. In some embodiments, the doped region 42 can be an n-type doped region. In other embodiments, the doped region 42 can be a p-type doped region.

Several contacts 421$p$ can be disposed within the first portion 421 of the doped region 42. The contacts 421$p$ can be, for example, metal pads that are electrically coupled with the first portion 421 of the doped region 42. Several contacts 422$p$ can be disposed within the second portion 422 of the doped region 42. The contacts 422$p$ can be, for example, metal pads that are electrically coupled with the second portion 422 of the doped region 42.

Referring to FIG. 4A, the contacts 422$p$ may include contacts 422$p$1, 422$p$2 and 422$p$3. In the top view, the contacts 422$p$1 are disposed between the first portion 461 of the blocking region 46 and the well region 48. In the top view, the contacts 422$p$2 are disposed within the range of the doped region 49. In the top view, the contacts 422$p$3 are disposed between the second portion 462 of the blocking region 46 and the well region 48.

Several contacts 423$p$ can be disposed within the third portion 423 of the doped region 42. The contacts 423$p$ can be, for example, metal pads that are electrically coupled with the third portion 423 of the doped region 42.

In some embodiments, the gate regions 441, 442 and 443 can be disposed in a manner similar to that illustrated in accordance with FIG. 3A, and thus the details are not repeated here. The gate regions 441, 442 and 443 can include materials similar to those of the gate regions 341 and 342 described in accordance with FIG. 3A. The gate regions 441 and 442 can also be referred to as gate electrodes 441 and 442.

Several contacts 441p/442p can be disposed within the gate region 443. The contacts 441p/442p can be, for example, metal pads that are electrically coupled with the gate region 443. Since the gate region 443 is in contact with the gate region 441, the contacts 441p/442p can also be electrically coupled with the gate region 441. Since the gate region 443 is in contact with the gate region 442, the contacts 441p/442p can also be electrically coupled with the gate region 442.

The blocking region 46 includes a first portion 461 and a second portion 462. The blocking region 46 can also be referred to as a blocking layer 46. The first portion 461 and the second portion 462 of the blocking region 46 can be disposed in a manner similar to that illustrated in accordance with FIG. 3A, and thus the details are not repeated here. In some embodiments, the blocking layer 46 can be a silicide blocking layer. The blocking layer 46 can improve, to a certain extent, the ESD robustness of the semiconductor device 400.

In the top view, the well region 48 can be disposed between the first portion 461 of the blocking region 46 and the second portion 462 of the blocking region 46. The well region 48 includes a width W. In some embodiments, the width W of the well region 48 may range from about 0.55 um to about 1.55 um.

A distance s1 may exist between an edge of the first portion 461 of the blocking region 46 and an edge of the well region 48. A distance s2 may exist between an edge of the second portion 462 of the blocking region 46 and an edge of the well region 48. In some embodiments, the distance s1 can be substantially identical to the distance s2. In some embodiments, the distance s1 can be different from the distance s2. In some embodiments, the distance s1 may range from about 0.1 um to about 0.8 um. In some embodiments, the distance s2 may range from about 0.1 um to about 0.8 um.

In the top view, a major portion of the doped region 49 can be disposed within the range of the well region 48. The doped region 49 can have a width W2 smaller than the width W of the well region 48. In some embodiments, the doped region 49 includes impurities/dopants of a type different from that of the doped region 42. In some embodiments, the doped region 49 can be a p-type doped region surrounded by the second portion 422 of an n-type doped region 42. In other embodiments, the doped region 49 can be an n-type doped region surrounded by the second portion 422 of a p-type doped region 42.

When ESD events occur, a high voltage/current may be applied to the contact 422p. The well region 48 in contact with the doped region 42 may facilitate passing the high voltage/current from the contact 422p toward the bulk/body (not shown) of the semiconductor 400. The well region 48 having the same type of impurities/dopants as the doped region 42 may facilitate directing the high voltage/current from the contact 422p toward the bulk/body (not shown) of the semiconductor 400. Passing/directing high voltage/current toward the bulk/body can reduce the possibility of the semiconductor 400 being damaged by the ESD events. The well region 48 can reduce the possibility of the other circuits adjacent to the semiconductor 400 being damaged by the ESD events. The well region 48 can reduce the possibility of the other circuits coupled with the semiconductor 400 being damaged by the ESD events.

PNP junctions may be formed between the doped region 42, the well region 48 and the doped region 49. The doped region 49 may reduce the break down voltage of the semiconductor 400. When ESD events occur, a high voltage/current may be easier to pass/direct from the contact 422p toward the bulk/body (not shown) of the semiconductor 400. The doped region 49 can reduce the possibility of the other circuits adjacent to the semiconductor 400 being damaged by the ESD events. The doped region 49 can reduce the possibility of the other circuits coupled with the semiconductor 400 being damaged by the ESD events.

Figure 4B:
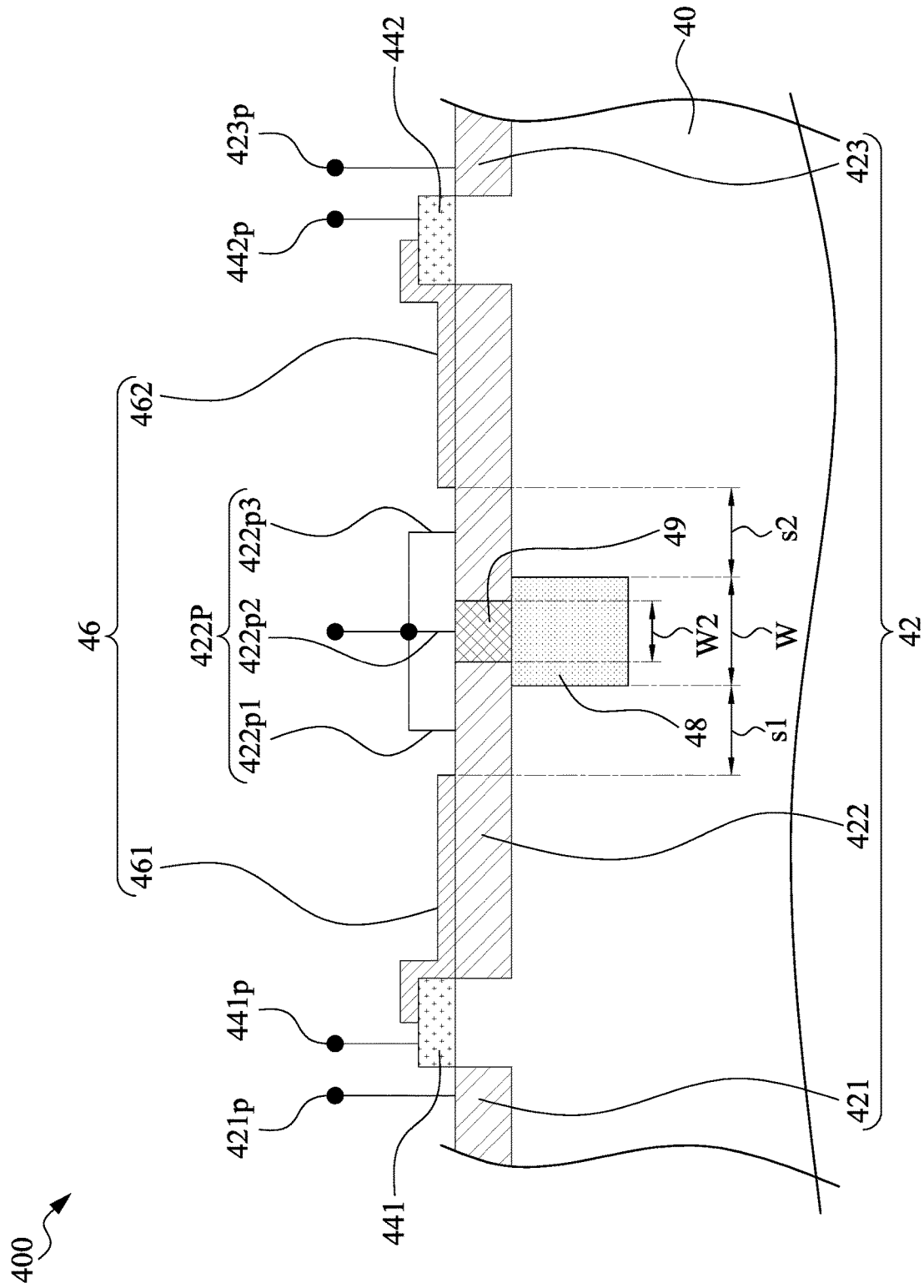
FIG. 4B illustrates a schematic view of a cross-sectional view of a semiconductor device, in accordance with some embodiments of the present disclosure.

FIG. 4B illustrates a schematic view of a cross-sectional view of a semiconductor device, in accordance with some embodiments of the present disclosure.

FIG. 4B shows a cross-sectional view of the semiconductor device 400. FIG. 4B can be a cross-sectional view along the dotted-line D of FIG. 4A. The semiconductor device 400 includes a substrate 40, a doped region 42, gate electrodes 441 and 442, and a blocking layer 46. The semiconductor device 400 further includes a well region 48 and a doped region 49.

In some embodiments, the substrate 40 can include intrinsic semiconductor materials. In some embodiments, the substrate 40 can include extrinsic semiconductor materials. In some embodiments, the substrate 40 can be lightly doped. In some embodiments, the substrate 40 can be a p-type substrate. In other embodiments, the substrate 40 can be an n-type substrate.

The doped region 42 includes a first portion 421, a second portion 422 and a third portion 423. The first portion 421 can be a source region of the semiconductor device 400. The second portion 422 can be a drain region of the semiconductor device 400. The third portion 423 can be another source region of the semiconductor device 400. In some embodiments, the doped region 42 can be an n-type doped region. In other embodiments, the doped region 42 can be a p-type doped region.

The gate electrodes 441 and 442 can be disposed in a manner similar to that described in accordance with FIG. 3B, and thus the details are not repeated here. The blocking layer 46 includes a first portion 461 and a second portion 462. The first portion 461 and the second portion 462 of the blocking layer 46 can be disposed in a manner similar to that described in accordance with FIG. 3B, and thus the details are not repeated here.

The contact 421p can be electrically coupled with the first region 421 of the doped region 42. The contact 422p can be electrically coupled with the second region 422 of the doped region 42. The contact 422p2 can be electrically coupled with the doped region 49. The contact 423p can be electrically coupled with the third region 423 of the doped region 42. The contact 441p can be electrically coupled with the gate electrode 441. The contact 442p can be electrically coupled with the gate electrode 442.

The well region 48 can be disposed under the second region 422 of the doped region 42. The well region 48 can be disposed under the doped region 49. The well region 48 can be embedded within the substrate 40. The well region 48 can be in contact with the second region 422 of the doped region 42. The well region 48 can be in contact with the doped region 49.

The well region 48 can have a width W. A distance s1 may exist between the first portion 461 of the blocking region 46 and the well region 48. A distance s2 may exist between the second portion 462 of the blocking region 46 and the well region 48.

In some embodiments, the well region 48 may include impurities/dopants of a first type. In some embodiments, the well region 48 may include impurities/dopants of a type different from that of the substrate 40. In some embodiments, the well region 48 may include impurities/dopants of a type identical to that of the doped region 42. The dosage of the impurities/dopants of the doped region 42 can be higher than that of the well region 48.

In some embodiments, the well region 48 can be an n-type well embedded within a p-type substrate 40. In other embodiments, the well region 48 can be a p-type well embedded within an n-type substrate 40. In some embodiments, the well region 48 can be an n-type well in contact with the second portion 422 of the n-type doped region 42. In other embodiments, the well region 48 can be a p-type well in contact with the second portion 422 of the p-type doped region 42.

The doped region 49 can be embedded within the second portion 422 of the doped region 42. The doped region 49 can be disposed above the well region 48. The doped region 49 can be in contact with the well region 48.

The doped region 49 can have a width smaller than the width W of the well region 48. In some embodiments, the doped region 49 includes impurities/dopants of a type different from that of the doped region 42. In some embodiments, the doped region 49 can be a p-type doped region surrounded by the second portion 422 of an n-type doped region 42. In other embodiments, the doped region 49 can be an n-type doped region surrounded by the second portion 422 of a p-type doped region 42.

In some embodiments, the doped region 49 includes impurities/dopants of a type different from the impurities/dopants of the well region 48. In some embodiments, the doped region 49 can be a p-type doped region in contact with an n-type well region 48. In other embodiments, the doped region 49 can be an n-type doped region in contact with a p-type well region 48.

Figure 5A:
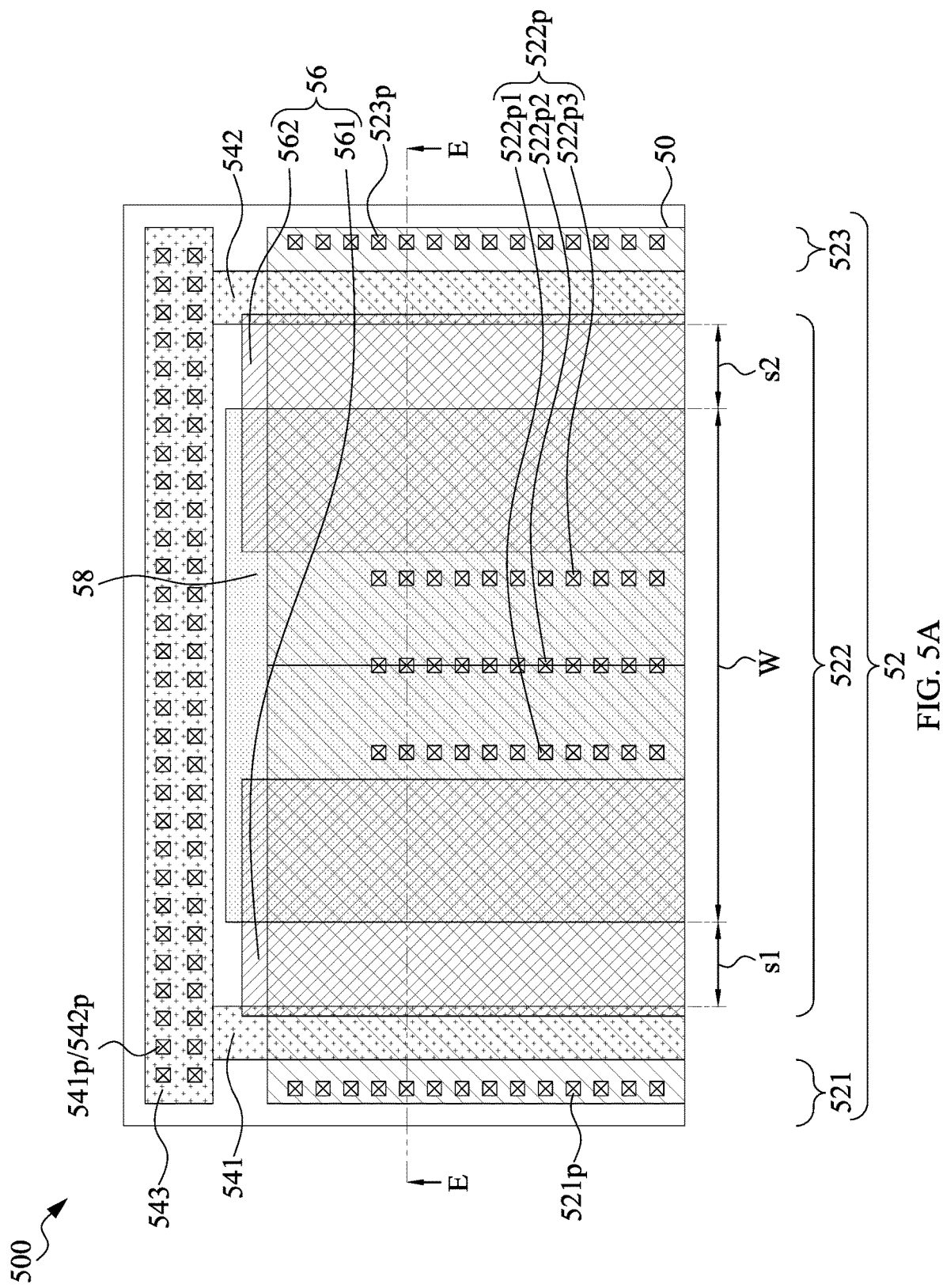
FIG. 5A illustrates a schematic view of a layout of a semiconductor device, in accordance with some embodiments of the present disclosure.

FIG. 5A illustrates a schematic view of a layout of a semiconductor device, in accordance with some embodiments of the present disclosure.

FIG. 5A shows a layout of a semiconductor device 500. The layout shown in FIG. 5A is the top view of a semiconductor device 500. The semiconductor device 500 includes an active region 50, a doped region 52, gate regions 541, 542 and 543, and a blocking region 56. The semiconductor device 500 further includes a well region 58.

The active region 50 can be referred to as a substrate 50 in the subsequent paragraphs. The doped region 52 includes a first portion 521, a second portion 522 and a third portion 523. The first portion 521 can be a source region of the semiconductor device 500. The second portion 522 can be a drain region of the semiconductor device 500. The third portion 523 can be another source region of the semiconductor device 500. In some embodiments, the doped region 52 can be an n-type doped region. In other embodiments, the doped region 52 can be a p-type doped region.

Several contacts 521*p* can be disposed within the first portion 521 of the doped region 52. The contacts 521*p* can be, for example, metal pads that are electrically coupled with the first portion 521 of the doped region 52. Several contacts 522*p* can be disposed within the second portion 522 of the doped region 52. The contacts 522*p* can be, for example, metal pads that are electrically coupled with the second portion 522 of the doped region 52.

Referring to FIG. 5A, the contacts 522*p* may include contacts 522*p*1, 522*p*2 and 522*p*3. In the top view, the contacts 522*p*1, 522*p*2 and 522*p*3 are disposed between the first portion 561 and the second portion 562 of the blocking region 56.

Several contacts 523*p* can be disposed within the third portion 523 of the doped region 52. The contacts 523*p* can be, for example, metal pads that are electrically coupled with the third portion 523 of the doped region 52.

In some embodiments, the gate regions 541, 542 and 543 can be disposed in a manner similar to that illustrated in accordance with FIG. 3A, and thus the details are not repeated here. The gate regions 541, 542 and 543 can include materials similar to those of the gate regions 341 and 342 described in accordance with FIG. 3A. The gate regions 541 and 542 can also be referred to as gate electrodes 541 and 542.

Several contacts 541*p*/542*p* can be disposed within the gate region 543. The contacts 541*p*/542*p* can be, for example, metal pads that are electrically coupled with the gate region 543. Since the gate region 543 is in contact with the gate region 541, the contacts 541*p*/542*p* can also be electrically coupled with the gate region 541. Since the gate region 543 is in contact with the gate region 542, the contacts 541*p*/542*p* can also be electrically coupled with the gate region 542.

The blocking region 56 includes a first portion 561 and a second portion 562. The blocking region 56 can also be referred to as a blocking layer 56. The first portion 561 and the second portion 562 of the blocking region 56 can be disposed in a manner similar to that described in accordance with FIG. 3A, and thus the details are not repeated here. In some embodiments, the blocking layer 56 can be a silicide blocking layer. The blocking layer 56 can improve, to a certain extent, the ESD robustness of the semiconductor device 500.

In the top view, the well region 58 can be disposed between the gate region 541 and the gate region 542. In the top view, the well region 58 can be partially overlapped with the first portion 561 of the blocking region 56. In the top view, the well region 58 can be partially overlapped with the second portion 562 of the blocking region 56. The well region 58 includes a width W. In some embodiments, the width W of the well region 58 may range from about 0.55 um to about 1.55 um.

A distance s1 may exist between an edge of the gate region 541 and an edge of the well region 58. A distance s2 may exist between an edge of the gate region 542 and an edge of the well region 58. In some embodiments, the distance s1 can be substantially identical to the distance s2. In some embodiments, the distance s1 can be different from the distance s2. In some embodiments, the distance s1 may range from about 1.45 um to about 1.95 um. In some embodiments, the distance s2 may range from about 1.45 um to about 1.95 um.

Figure 5B:
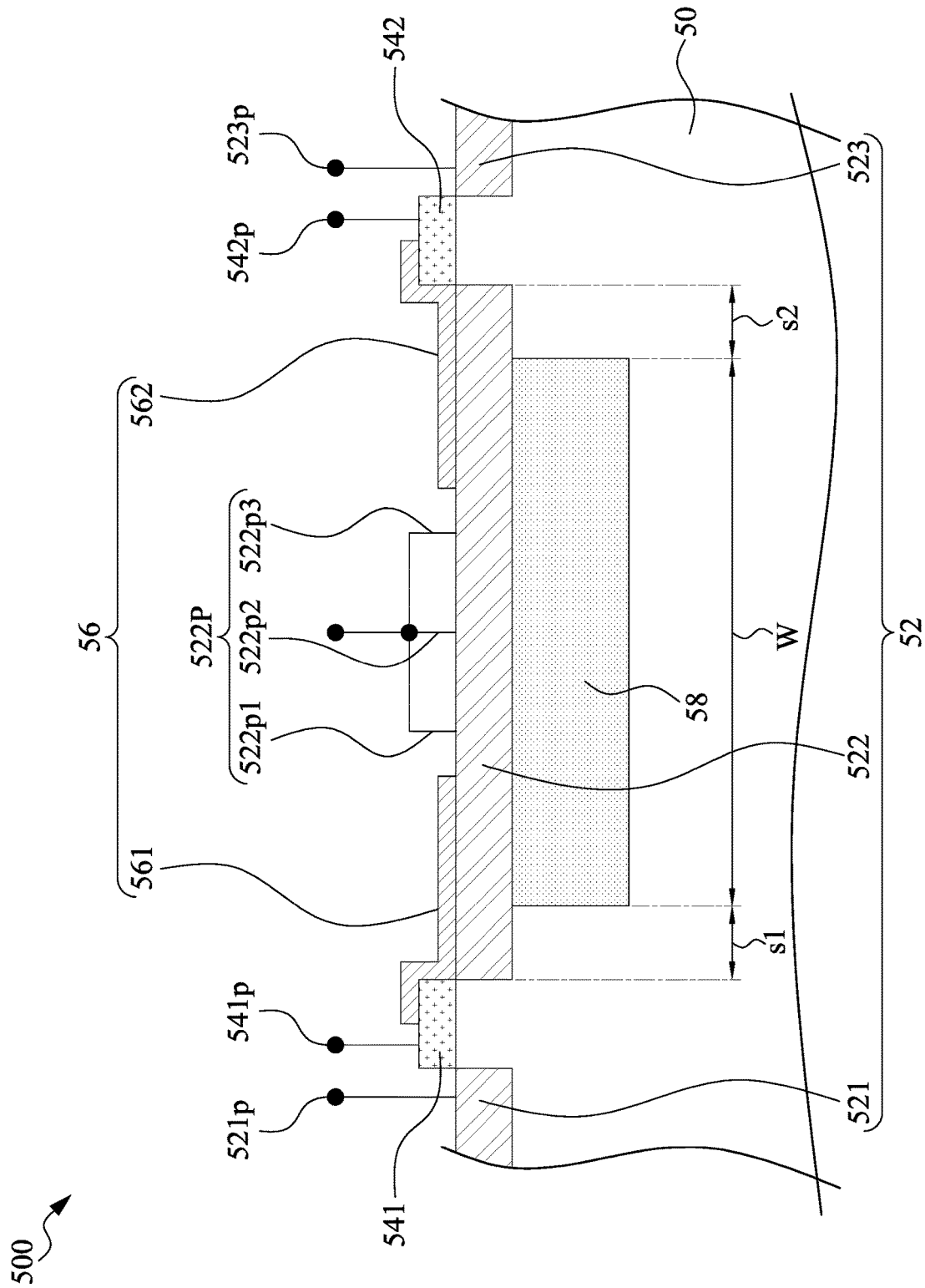
FIG. 5B illustrates a schematic view of a cross-sectional view of a semiconductor device, in accordance with some embodiments of the present disclosure.

FIG. 5B illustrates a schematic view of a cross-sectional view of a semiconductor device, in accordance with some embodiments of the present disclosure.

FIG. 5B shows a cross-sectional view of the semiconductor device 500. FIG. 5B can be a cross-sectional view along the dotted-line E of FIG. 5A. The semiconductor device 500 includes a substrate 50, a doped region 52, gate electrodes 541 and 542, and a blocking layer 56. The semiconductor device 500 further includes a well region 58.

In some embodiments, the substrate 50 can include intrinsic semiconductor materials. In some embodiments, the substrate 50 can include extrinsic semiconductor materials. In some embodiments, the substrate 50 can be lightly doped.

In some embodiments, the substrate 50 can be a p-type substrate. In other embodiments, the substrate 50 can be an n-type substrate.

The doped region 52 includes a first portion 521, a second portion 522 and a third portion 523. The first portion 521 can be a source region of the semiconductor device 500. The second portion 522 can be a drain region of the semiconductor device 500. The third portion 523 can be another source region of the semiconductor device 500. In some embodiments, the doped region 52 can be an n-type doped region. In other embodiments, the doped region 52 can be a p-type doped region.

The gate electrodes 541 and 542 can be disposed in a manner similar to that described in accordance with FIG. 3B, and thus the details are not repeated here. The blocking layer 56 includes a first portion 561 and a second portion 562. The first portion 561 and the second portion 562 of the blocking layer 56 can be disposed in a manner similar to that described in accordance with FIG. 3B, and thus the details are not repeated here.

The contact 521$p$ can be electrically coupled with the first region 521 of the doped region 52. The contact 522$p$ can be electrically coupled with the second region 522 of the doped region 52. The contact 523$p$ can be electrically coupled with the third region 523 of the doped region 52. The contact 541$p$ can be electrically coupled with the gate electrode 541. The contact 542$p$ can be electrically coupled with the gate electrode 542.

The well region 58 can be disposed under the second region 522 of the doped region 52. The well region 58 can be embedded within the substrate 50. The well region 58 can be in contact with the second region 522 of the doped region 52.

The well region 58 can have a width W. A distance s1 may exist between the gate region 541 and the well region 58. A distance s2 may exist between the gate region 542 and the well region 58.

In some embodiments, the well region 58 may include impurities/dopants of a first type. In some embodiments, the well region 58 may include impurities/dopants of a type different from that of the substrate 50. In some embodiments, the well region 58 may include impurities/dopants of a type identical to that of the doped region 52. The dosage of the impurities/dopants of the doped region 52 can be higher than that of the well region 58.

In some embodiments, the well region 58 can be an n-type well embedded within a p-type substrate 50. In other embodiments, the well region 58 can be a p-type well embedded within an n-type substrate 50. In some embodiments, the well region 58 can be an n-type well in contact with the second portion 522 of the n-type doped region 52. In other embodiments, the well region 58 can be a p-type well in contact with the second portion 522 of the p-type doped region 52.

When ESD events occur, a high voltage/current may be applied to the contact 522$p$. The well region 58 in contact with the doped region 52 may facilitate passing the high voltage/current from the contact 522$p$ toward the bulk/body (not shown) of the semiconductor 500. The well region 58 having the same type of impurities/dopants as the doped region 52 may facilitate directing the high voltage/current from the contact 522$p$ toward the bulk/body (not shown) of the semiconductor 500. Passing/directing high voltage/current toward the bulk/body can reduce the possibility of the semiconductor 500 being damaged by the ESD events. The well region 58 can reduce the possibility of the other circuits adjacent to the semiconductor 500 being damaged by the ESD events. The well region 58 can reduce the possibility of the other circuits coupled with the semiconductor 500 being damaged by the ESD events.

Figure 6A:
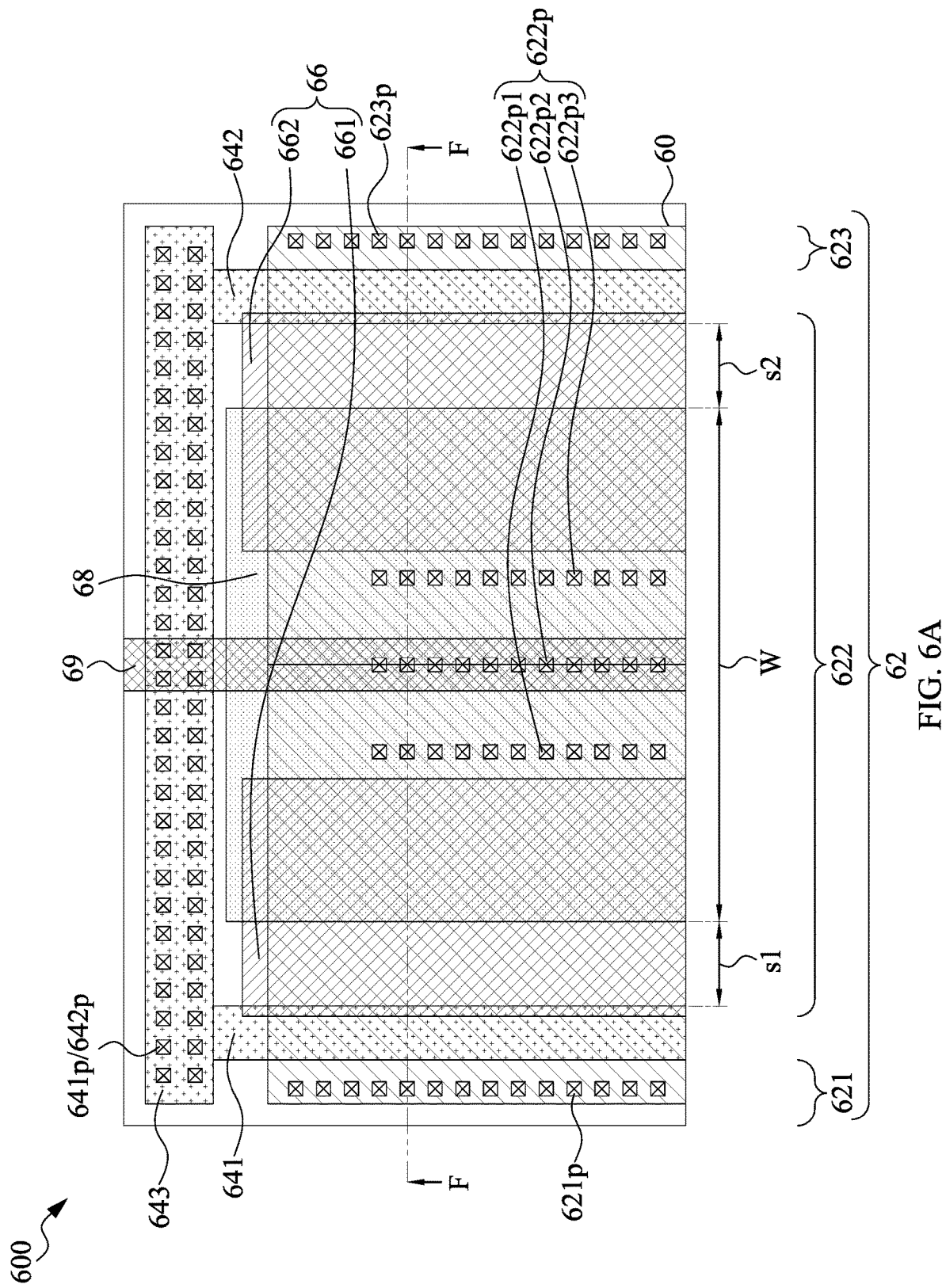
FIG. 6A illustrates a schematic view of a layout of a semiconductor device, in accordance with some embodiments of the present disclosure.

FIG. 6A illustrates a schematic view of a layout of a semiconductor device, in accordance with some embodiments of the present disclosure.

FIG. 6A shows a layout of a semiconductor device 600. The layout shown in FIG. 6A is the top view of a semiconductor device 600. The semiconductor device 600 includes an active region 60, a doped region 62, gate regions 641, 642 and 643, and a blocking region 66. The semiconductor device 600 further includes a well region 68 and a doped region 69.

The active region 60 can be referred to as a substrate 60 in the subsequent paragraphs. The doped region 62 includes a first portion 621, a second portion 622 and a third portion 623. The first portion 621 can be a source region of the semiconductor device 600. The second portion 622 can be a drain region of the semiconductor device 600. The third portion 623 can be another source region of the semiconductor device 600. In some embodiments, the doped region 62 can be an n-type doped region. In other embodiments, the doped region 62 can be a p-type doped region.

Several contacts 621$p$ can be disposed within the first portion 621 of the doped region 62. The contacts 621$p$ can be, for example, metal pads that are electrically coupled with the first portion 621 of the doped region 62. Several contacts 622$p$ can be disposed within the second portion 622 of the doped region 62. The contacts 622$p$ can be, for example, metal pads that are electrically coupled with the second portion 622 of the doped region 62.

Referring to FIG. 6A, the contacts 622$p$ may include contacts 622$p$1, 622$p$2 and 622$p$3. In the top view, the contacts 622$p$1 are disposed between the first portion 661 of the blocking region 66 and the doped region 69. In the top view, the contacts 622$p$2 are disposed within the range of the doped region 69. In the top view, the contacts 622$p$3 are disposed between the second portion 662 of the blocking region 66 and the doped region 69.

Several contacts 623$p$ can be disposed within the third portion 623 of the doped region 62. The contacts 623$p$ can be, for example, metal pads that are electrically coupled with the third portion 623 of the doped region 62.

In some embodiments, the gate regions 641, 642 and 643 can be disposed in a manner similar to that illustrated in accordance with FIG. 3A, and thus the details are not repeated here. The gate regions 641, 642 and 643 can include materials similar to those of the gate regions 641 and 642 described in accordance with FIG. 3A. The gate regions 641 and 642 can also be referred to as gate electrodes 641 and 642.

Several contacts 641$p$/642$p$ can be disposed within the gate region 643. The contacts 641$p$/642$p$ can be, for example, metal pads that are electrically coupled with the gate region 643. Since the gate region 643 is in contact with the gate region 641, the contacts 641$p$/642$p$ can also be electrically coupled with the gate region 641. Since the gate region 643 is in contact with the gate region 642, the contacts 641$p$/642$p$ can also be electrically coupled with the gate region 642.

The blocking region 66 includes a first portion 661 and a second portion 662. The blocking region 66 can also be referred to as a blocking layer 66. The first portion 661 and the second portion 662 of the blocking region 66 can be disposed in a manner similar to that illustrated in accordance with FIG. 3A, and thus the details are not repeated here. In some embodiments, the blocking layer 66 can be a silicide blocking layer. The blocking layer 66 can improve, to a certain extent, the ESD robustness of the semiconductor device 600.

In the top view, the well region 68 can be disposed between the gate region 641 and the gate region 642. In the top view, the well region 68 can be partially overlapped with the first portion 661 of the blocking region 66. In the top view, the well region 68 can be partially overlapped with the second portion 662 of the blocking region 66. The well region 68 includes a width W. In some embodiments, the width W of the well region 68 may range from about 0.55 um to about 1.55 um.

A distance s1 may exist between an edge of the gate region 641 and an edge of the well region 68. A distance s2 may exist between an edge of the gate region 642 and an edge of the well region 68. In some embodiments, the distance s1 can be substantially identical to the distance s2. In some embodiments, the distance s1 can be different from the distance s2. In some embodiments, the distance s1 may range from about 1.45 um to about 1.95 um. In some embodiments, the distance s2 may range from about 1.45 um to about 1.95 um.

In the top view, a major portion of the doped region 69 can be disposed within the range of the well region 68. The doped region 69 can have a width W2 smaller than the width W of the well region 68. In some embodiments, the doped region 69 includes impurities/dopants of a type different from that of the doped region 62. In some embodiments, the doped region 69 can be a p-type doped region surrounded by the second portion 622 of an n-type doped region 62. In other embodiments, the doped region 69 can be an n-type doped region surrounded by the second portion 622 of a p-type doped region 62.

Figure 6B:
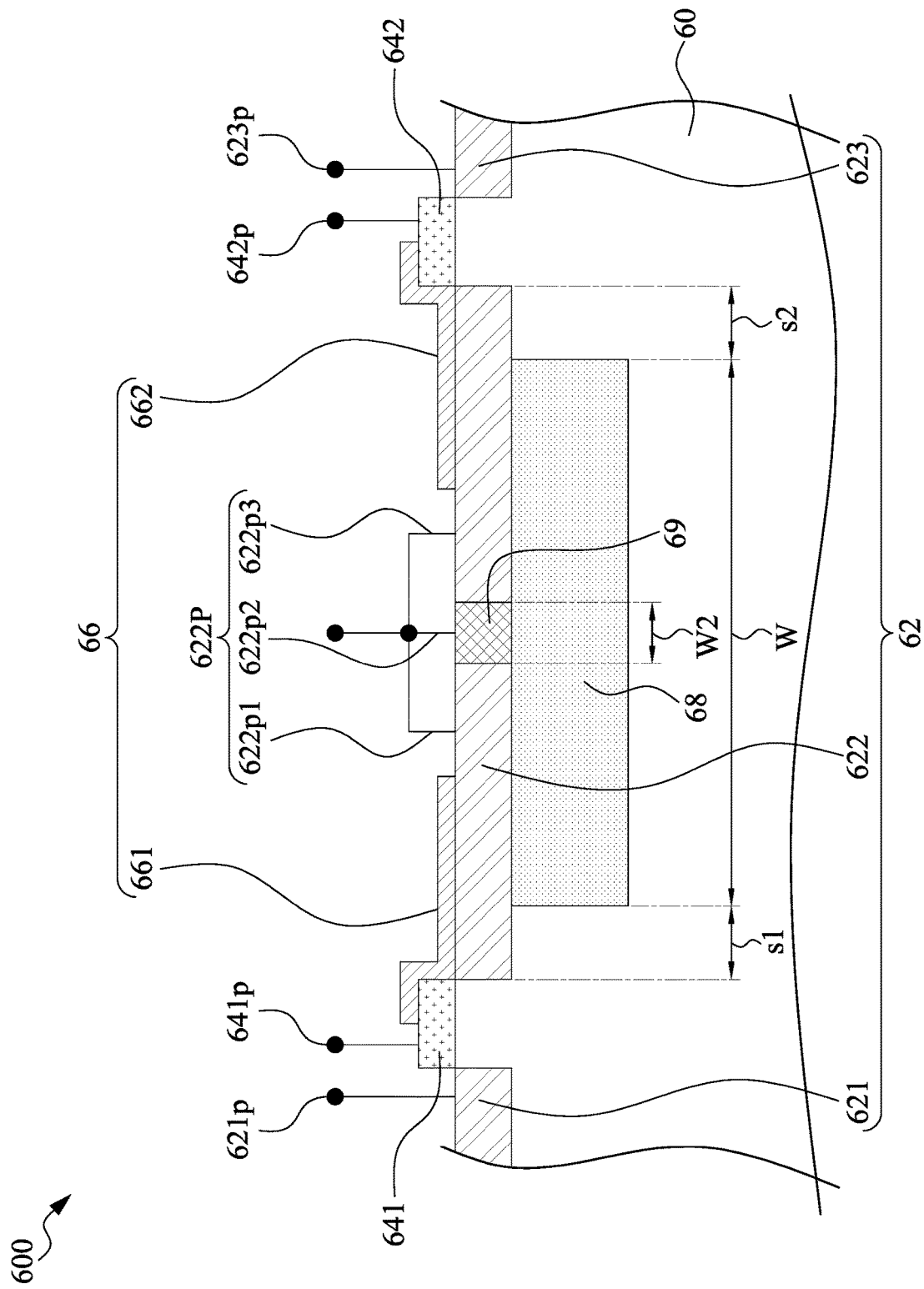
FIG. 6B illustrates a schematic view of a cross-sectional view of a semiconductor device, in accordance with some embodiments of the present disclosure.

FIG. 6B illustrates a schematic view of a cross-sectional view of a semiconductor device, in accordance with some embodiments of the present disclosure.

FIG. 6B shows a cross-sectional view of the semiconductor device 600. FIG. 6B can be a cross-sectional view along the dotted-line F of FIG. 6A. The semiconductor device 600 includes a substrate 60, a doped region 62, gate electrodes 641 and 642, and a blocking layer 66. The semiconductor device 600 further includes a well region 68 and a doped region 69.

In some embodiments, the substrate 60 can include intrinsic semiconductor materials. In some embodiments, the substrate 60 can include extrinsic semiconductor materials. In some embodiments, the substrate 60 can be lightly doped. In some embodiments, the substrate 60 can be a p-type substrate. In other embodiments, the substrate 60 can be an n-type substrate.

The doped region 62 includes a first portion 621, a second portion 622 and a third portion 623. The first portion 621 can be a source region of the semiconductor device 600. The second portion 622 can be a drain region of the semiconductor device 600. The third portion 623 can be another source region of the semiconductor device 600. In some embodiments, the doped region 62 can be an n-type doped region. In other embodiments, the doped region 62 can be a p-type doped region.

The gate electrodes 641 and 642 can be disposed in a manner similar to that described in accordance with FIG. 3B, and thus the details are not repeated here. The blocking layer 66 includes a first portion 661 and a second portion 662. The first portion 661 and the second portion 662 of the blocking layer 66 can be disposed in a manner similar to that described in accordance with FIG. 3B, and thus the details are not repeated here.

The contact 621p can be electrically coupled with the first region 621 of the doped region 62. The contact 622p can be electrically coupled with the second region 622 of the doped region 62. The contact 622p2 can be electrically coupled with the doped region 69. The contact 623p can be electrically coupled with the third region 623 of the doped region 62. The contact 641p can be electrically coupled with the gate electrode 641. The contact 642p can be electrically coupled with the gate electrode 642.

The well region 68 can be disposed under the second region 622 of the doped region 62. The well region 68 can be disposed under the doped region 69. The well region 68 can be embedded within the substrate 60. The well region 68 can be in contact with the second region 622 of the doped region 62. The well region 68 can be in contact with the doped region 69.

The well region 68 can have a width W. A distance s1 may exist between the gate region 641 and the well region 68. A distance s2 may exist between the gate region 642 and the well region 68.

In some embodiments, the well region 68 may include impurities/dopants of a first type. In some embodiments, the well region 68 may include impurities/dopants of a type different from that of the substrate 60. In some embodiments, the well region 68 may include impurities/dopants of a type identical to that of the doped region 62. The dosage of the impurities/dopants of the doped region 62 can be higher than that of the well region 68.

In some embodiments, the well region 68 can be an n-type well embedded within a p-type substrate 60. In other embodiments, the well region 68 can be a p-type well embedded within an n-type substrate 60. In some embodiments, the well region 68 can be an n-type well in contact with the second portion 622 of the n-type doped region 62. In other embodiments, the well region 68 can be a p-type well in contact with the second portion 622 of the p-type doped region 62.

The doped region 69 can have a width smaller than the width W of the well region 68. In some embodiments, the doped region 69 includes impurities/dopants of a type different from that of the doped region 62. In some embodiments, the doped region 69 can be a p-type doped region surrounded by the second portion 622 of an n-type doped region 62. In other embodiments, the doped region 69 can be an n-type doped region surrounded by the second portion 622 of a p-type doped region 62.

In some embodiments, the doped region 69 includes impurities/dopants of a type different from the impurities/dopants of the well region 68. In some embodiments, the doped region 69 can be a p-type doped region in contact with an n-type well region 68. In other embodiments, the doped region 69 can be an n-type doped region in contact with a p-type well region 68.

When ESD events occur, a high voltage/current may be applied to the contact 622p. The well region 68 in contact with the doped region 62 may facilitate passing the high voltage/current from the contact 622p toward the bulk/body (not shown) of the semiconductor 600. The well region 68 having the same type of impurities/dopants as the doped region 62 may facilitate directing the high voltage/current from the contact 622p toward the bulk/body (not shown) of the semiconductor 600. Passing/directing high voltage/current toward the bulk/body can reduce the possibility of the semiconductor 600 being damaged by the ESD events. The well region 68 can reduce the possibility of the other circuits adjacent to the semiconductor 600 being damaged by the ESD events. The well region 68 can reduce the possibility of the other circuits coupled with the semiconductor 600 being damaged by the ESD events.

PNP junctions may be formed between the doped region 62, the well region 68 and the doped region 69. The doped region 69 may reduce the break down voltage of the semiconductor 600. When ESD events occur, a high voltage/current may be easier to pass/be directed from the contact 622p toward the bulk/body (not shown) of the semiconductor 600. The doped region 69 can reduce the possibility of the other circuits adjacent to the semiconductor 600 being damaged by the ESD events. The doped region 69 can reduce the possibility of the other circuits coupled with the semiconductor 600 being damaged by the ESD events.

Figure 7:
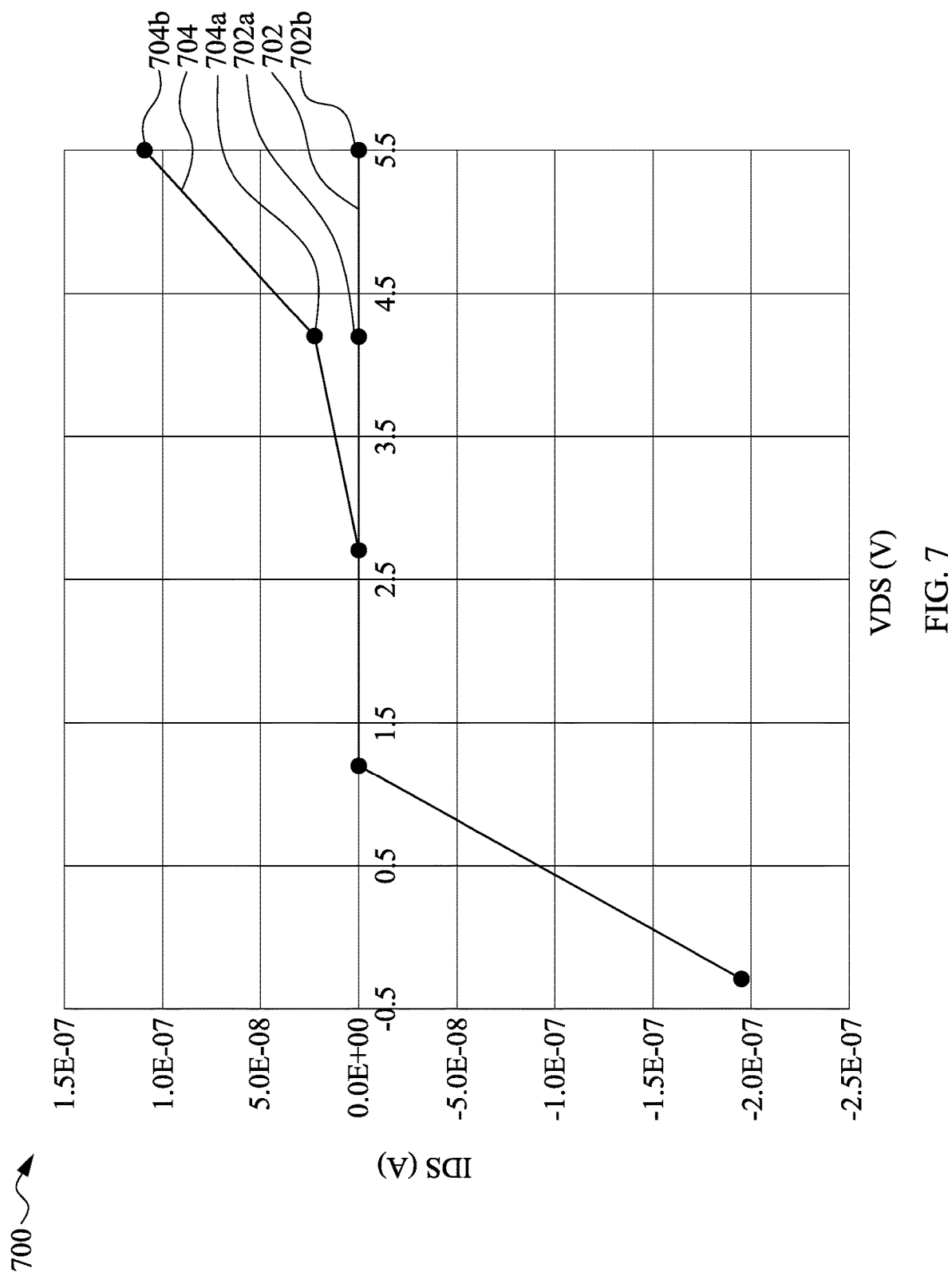
FIG. 7 illustrates a diagram of the ESD test results of a semiconductor device, in accordance with some embodiments of the present disclosure.

FIG. 7 illustrates a diagram of the ESD test results of a semiconductor device, in accordance with some embodiments of the present disclosure.

FIG. 7 shows a diagram 700, in which the ESD test results of a semiconductor device is provided. The diagram 700 can be the ESD test results of the semiconductor device 100 as shown in FIGS. 1A and 1B. The horizontal axis represents the voltage $V_{DS}$ applied across the drain and the source of the semiconductor device, in the unit of volts. The vertical axis represents the current $I_{DS}$ flowing from the drain to the source of the semiconductor device, in the unit of amperes.

The line 702 is the characteristic of the semiconductor device before an ESD event occurs. When a voltage $V_{DS}$ having an amplitude of between 3.5 volts and 4.5 volts (i.e., at the point 702a) is applied across the drain and the source of the semiconductor device, the current $I_{DS}$ remains zero. In addition, when a voltage $V_{DS}$ having an amplitude of 5.5 volts (i.e., at the point 702b) is applied across the drain and the source of the semiconductor device, the current $I_{DS}$ remains zero.

The line 704 is the characteristic of the semiconductor device after an ESD event of 250 volts occurs. When a voltage $V_{DS}$ having an amplitude of between 3.5 volts and 4.5 volts (i.e., at the point 704a) is applied across the drain and the source of the semiconductor device, the current $I_{DS}$ is greater than zero. In addition, when a voltage $V_{DS}$ having an amplitude of 5.5 volts (i.e., at the point 704b) is applied across the drain and the source of the semiconductor device, the current $I_{DS}$ is greater than 1.0E-07 (i.e., $10^{-7}$) amperes.

Referring to line 704, it means that the semiconductor device cannot stand a 250 volts ESD events, because the semiconductor device has a current leakage even under a small $V_{DS}$.

Figure 8:
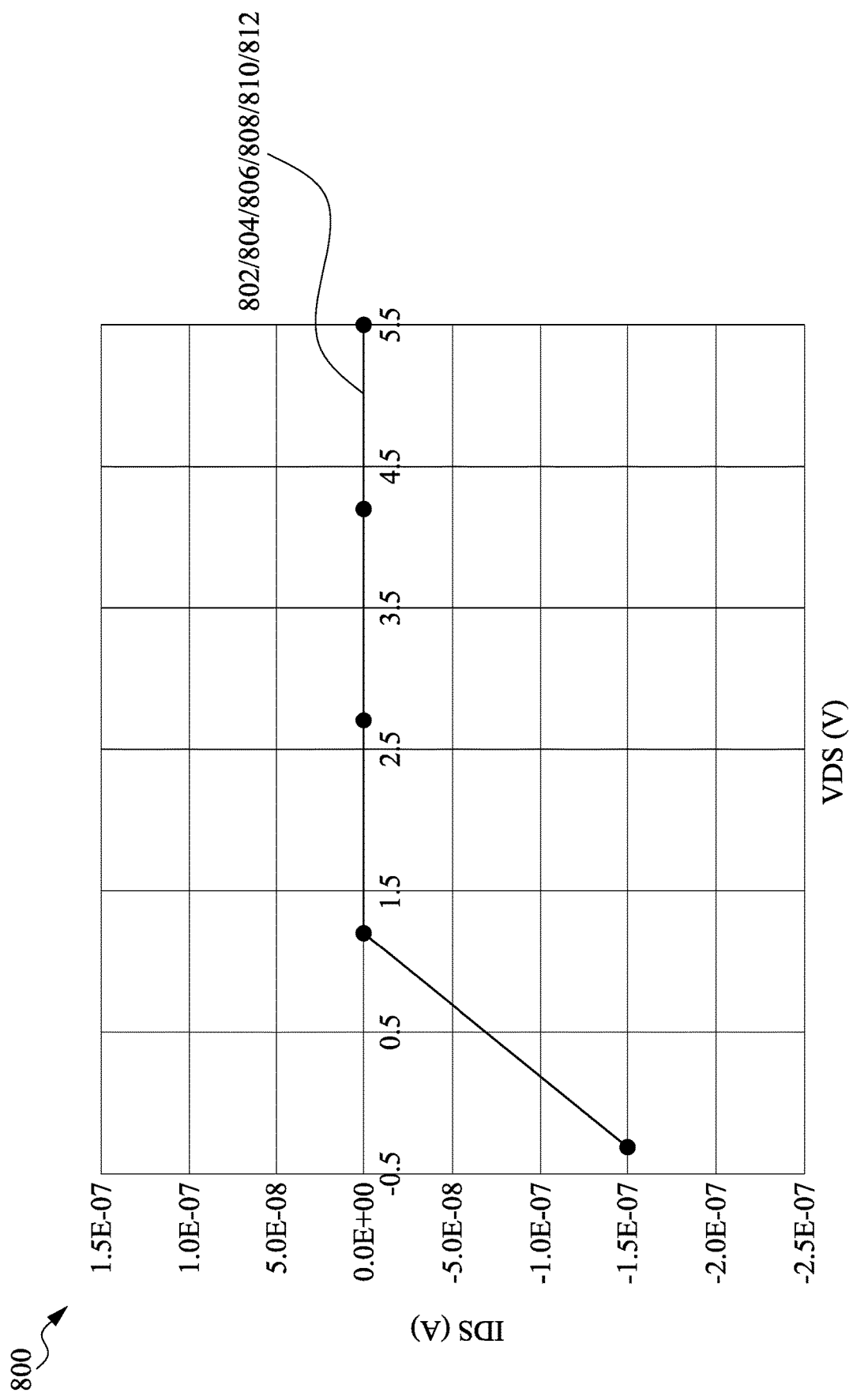
FIG. 8 illustrates a diagram of the ESD test results of a semiconductor device, in accordance with some embodiments of the present disclosure.

FIG. 8 illustrates a diagram of the ESD test results of a semiconductor device, in accordance with some embodiments of the present disclosure.

FIG. 8 shows a diagram 800, in which the ESD test results of a semiconductor device are provided. The diagram 800 can be the ESD test results of the semiconductor devices 200, 300, 400, 500 or 600 as shown in FIGS. 2A, 2B, 3A, 3B, 4A, 4B, 5A, 5B, 6A and 6B, respectively. The horizontal axis represents the voltage $V_{DS}$ applied across the drain and the source of a semiconductor device, in the unit of volts. The vertical axis represents the current $I_{DS}$ flows from the drain to the source of the semiconductor device, in the unit of amperes.

The line 802 is the characteristic of the semiconductor device before an ESD event occurs. The line 804 is the characteristic of the semiconductor device after an ESD event of 250 volts occurs. The line 806 is the characteristic of the semiconductor device after an ESD event of 1000 volts occurs. The line 808 is the characteristic of the semiconductor device after an ESD event of 2000 volts occurs. The line 810 is the characteristic of the semiconductor device after an ESD event of 3000 volts occurs. The line 812 is the characteristic of the semiconductor device after an ESD event of 4500 volts occurs.

Referring to the results as shown in the diagram 800, the lines 802-812 are overlapped with each other, which means that the semiconductor device can stand up to 4500 volt ESD events, because after an ESD event of 4500 volts occurs, the current $I_{DS}$ remains zero when a voltage $V_{DS}$ of 5.5 volts is applied across the drain and the source of a semiconductor device.

Figure 9:
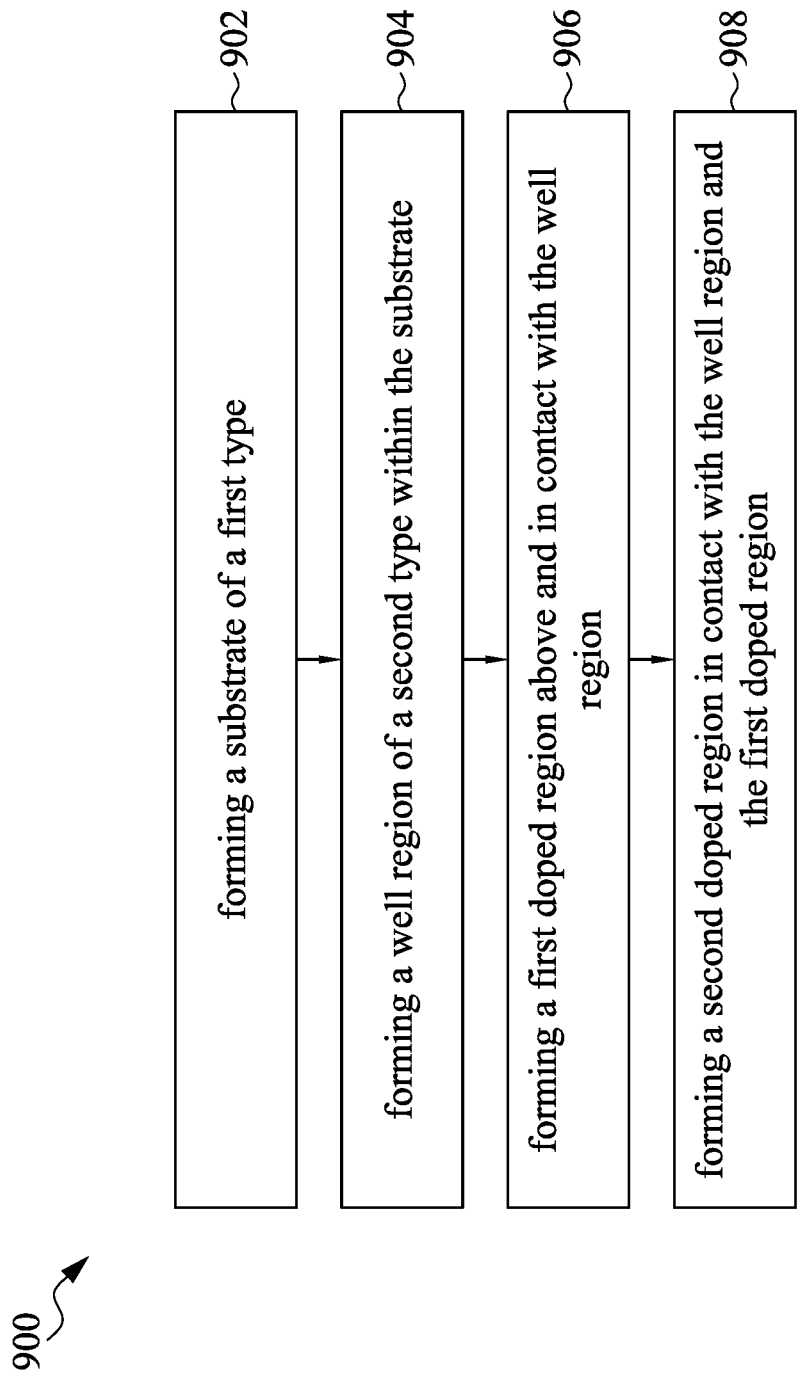
FIG. 9 illustrates a flow chart including the operations of manufacturing a semiconductor device, in accordance with some embodiments of the present disclosure.

FIG. 9 illustrates a flow chart including the operations of manufacturing a semiconductor device, in accordance with some embodiments of the present disclosure. FIG. 9 shows a flow chart 900. The flow chart 900 includes operations 902, 904, 906 and 908. Although the operations 902, 904, 906 and 908 of FIG. 9 are depicted in sequence, it can be contemplated that the operations 902, 904, 906 and 908 can be performed in an order different from that shown in FIG. 9.

In the operation 902, a substrate of a first type is formed. In some embodiments, the substrate can be a p-type substrate. In other embodiments, the substrate can be an n-type substrate. The operation 902 can be used to form the substrates 10, 20, 30, 40, 50 or 60 of the semiconductor devices 100, 200, 300, 400, 500 and 600.

In the operation 904, a well region of a second type is formed within the substrate. The second type is different from the first type. In some embodiments, the well region can be an n-type well region. In other embodiments, the well region can be a p-type well region. The operation 904 can be used to form the well regions 28, 38, 48, 58 or 68 of the semiconductor devices 200, 300, 400, 500 and 600.

In the operation 906, a first doped region above and in contact with the well region is formed. The first doped region can be of the second type. In some embodiments, the first doped region can be an n-type doped region. In other embodiments, the first doped region can be a p-type doped region. The operation 906 can be used to form the doped regions 12, 22, 32, 42, 52 or 62 of the semiconductor devices 100, 200, 300, 400, 500 and 600.

In the operation 908, a second doped region in contact with the well region and the first doped region is formed. The second doped region can be of the first type. In some embodiments, the second doped region can be a p-type doped region. In other embodiments, the second doped region can be an n-type doped region. The operation 908 can be used to form the doped regions 49 or 69 of the semiconductor devices 400 and 600.

Some embodiments of the present disclosure provide a semiconductor device. The semiconductor device comprises a substrate of a first type, a first doped region embedded within the substrate and having a first portion and a second portion, and a first gate electrode disposed above the substrate. The semiconductor device further comprises a well region of a second type and embedded within the substrate. The well region is in contact with the second portion of the first doped region.

Some embodiments of the present disclosure provide a semiconductor device. The semiconductor device comprises a substrate, a well region embedded within the substrate, and a first doped region disposed above and in contact with the well region, wherein the first doped region includes dopants of a first type and the well region includes dopants of the first type.

Some embodiments of the present disclosure provide a method of manufacturing a semiconductor device. The method comprises: forming a substrate of a first type, forming a well region of a second type within the substrate, and forming a first doped region above and in contact with the well region, wherein the first doped region includes dopants of the second type.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate of a first type;
    a first doped region of a second type embedded within the substrate and having a first portion and a second portion;
    a first gate electrode disposed above the substrate and between the first portion and the second portion of the first doped region; and
    a well region of the second type and embedded within the substrate, the well region including a first edge and a second edge;
    a second doped region embedded within the first doped region and includes dopants of different type from that of the first doped region; and
    a blocking layer disposed on the first doped region, wherein
    the well region is in contact with the second portion of the first doped region,
    a portion of the first edge and a portion of the second edge of the well region are underneath the second portion of the first doped region, and
    the blocking layer partially covers the first doped region and exposes the second doped region.

2. The semiconductor device of claim 1, wherein the blocking layer partially covers the first gate electrode and exposes a portion of the first gate electrode.

3. The semiconductor device of claim 2, wherein an edge of the blocking layer is spaced apart from an edge of the well region by a first distance.

4. The semiconductor device of claim 3, wherein the first distance ranges from about 0.1 um (micrometer) to about 0.8 um.

5. The semiconductor device of claim 2, wherein an edge of the first gate electrode is spaced apart from an edge of the well region by a first distance.

6. The semiconductor device of claim 5, wherein the first distance ranges from about 1.45 um to about 1.95 um.

7. The semiconductor device of claim 1, wherein the blocking layer partially covers the second portion of the first doped region and partially exposes the second portion of the first doped region.

8. The semiconductor device of claim 1, wherein a width of the well region ranges from about 0.55 um to about 1.55 um.

9. The semiconductor device of claim 1, wherein the first doped region includes dopants of the second type.

10. The semiconductor device of claim 1, wherein the second doped region is in contact with the well region embedded within the substrate.

11. The semiconductor device of claim 1, wherein the first gate electrode is disposed on a surface of the substrate, and the well region is separated from the surface of the substrate by the second portion of the first doped region.

12. A semiconductor device, comprising:
    a substrate;
    a well region embedded within the substrate;
    a first doped region disposed above and in contact with the well region;
    a second doped region in contact with the first doped region and the well region; and
    a blocking layer disposed on the first doped region, wherein
    the first doped region includes dopants of a first type and the well region includes dopants of the first type,
    a width of the first doped region is greater than a width of the well region,
    a portion of a first edge and a portion of a second edge of the well region are underneath the first doped region, and
    the blocking layer partially covers the first doped region and exposes the second doped region.

13. The semiconductor device of claim 12, wherein the blocking layer exposes a portion of the first doped region.

14. The semiconductor device of claim 13, further comprising a first contact in contact with the exposed portion of the first doped region.

15. The semiconductor device of claim 14, further comprising a second contact in contact with the exposed portion of the first doped region, wherein the second contact is disposed closer to an edge of the blocking layer than the first contact.

16. The semiconductor device of claim 12, wherein the second doped region includes dopants of a different type from those of the first doped region and the well region.

17. The semiconductor device of claim 12, wherein a width of the second doped region is different from a width of the well region.

18. The semiconductor device of claim 12, wherein the second doped region is embedded within the first doped region.

19. A method of manufacturing a semiconductor device, comprising:
    forming a substrate of a first type;
    forming a well region of a second type within the substrate;
    forming a first doped region above and in contact with the well region to separate the well region from a surface of the substrate;
    forming a second doped region in contact with the first doped region and the well region; and
    forming a blocking layer on the first doped region, wherein
    the first doped region includes dopants of the second type,
    a width of the first doped region is greater than a width of the well region,
    a first edge and a second edge of the well region are underneath the first doped region, and
    the blocking layer partially covers the first doped region and exposes the second doped region.

20. The method of claim 19, wherein the second doped region includes dopants of a different type from those of the first doped region and the well region.

* * * * *